United States Patent

Ota et al.

[11] Patent Number: 5,499,443
[45] Date of Patent: Mar. 19, 1996

[54] CONNECTOR PRESS-FITTING APPARATUS

[75] Inventors: Yasunori Ota; Nobuhide Fujita, both of Tokyo, Japan

[73] Assignee: Ando Electric Co., Ltd., Tokyo, Japan

[21] Appl. No.: 327,853

[22] Filed: Oct. 24, 1994

[30] Foreign Application Priority Data

| Oct. 25, 1993 | [JP] | Japan | 5-288675 |
| Oct. 29, 1993 | [JP] | Japan | 5-294089 |
| Jan. 31, 1994 | [JP] | Japan | 6-027278 |
| Mar. 31, 1994 | [JP] | Japan | 6-085627 |

[51] Int. Cl.$^6$ .......... H05K 3/30; H05K 13/04; B23P 19/04
[52] U.S. Cl. .......... 29/741; 29/593; 29/743; 29/845; 414/737
[58] Field of Search .......... 29/739, 740, 741, 29/743, 759, 837, 845, 593, 705; 414/737

[56] References Cited

U.S. PATENT DOCUMENTS

| 4,102,043 | 7/1978 | Andrade et al. | 29/739 |
| 4,553,322 | 11/1985 | Cappos et al. | 29/739 |
| 4,587,703 | 5/1986 | Azizi et al. | 29/743 X |
| 4,649,633 | 3/1987 | Bocchicchio et al. | 29/743 X |
| 4,951,383 | 8/1990 | Amao et al. | 29/743 X |
| 5,074,030 | 12/1991 | Anderson et al. | 29/845 X |
| 5,276,962 | 1/1994 | Harting et al. | 29/845 X |
| 5,400,502 | 3/1995 | Ota et al. | 29/741 X |

FOREIGN PATENT DOCUMENTS

| 3810975 | 10/1989 | Germany | 29/845 |
| 1300599 | 12/1989 | Japan | 29/743 |
| 595200 | 4/1993 | Japan | 29/743 |

*Primary Examiner*—Peter Vo
*Attorney, Agent, or Firm*—Finnegan, Henderson, Farabow, Garrett & Dunner

[57] ABSTRACT

A connector press-fitting apparatus for press-fitting a connector to a printed board has a storing mechanism for storing connectors; a positioning mechanism for maintaining, moving, and positioning a printed board; a press-fitting head having a surface with a channel opening facing a surface of the printed board and mounted to be accessible to and separable from the printed board maintained by the positioning mechanism; a head moving mechanism for moving the press-fitting head in relative to the printed board; a pressure-reducing mechanism for affixing a connector to the press-fitting head by reducing pressure of the above channel of the press-fitting head; a transporting portion for transporting connectors from the storing mechanism and delivering these connectors to the press-fitting head; and a pressure-receiving portion for supporting the printed board from a reverse face thereof at the time of press-fitting a connector to the printed board by the press-fitting mechanism.

15 Claims, 16 Drawing Sheets

CONNECTOR PRESS-FITTING APPARATUS

BACKGROUND OF THE INVENTION

1. Field of the Invention

The present invention relates to a connector press-fitting apparatus for press-fitting a connector to a printed board and the like.

2. Background Art

Recently, as a connector for installing semiconductor components such as LSI, IC, and the like into a printed board, a so-called "press-fit connector" is being widely used in which mounting is completed by simply press-fitting pins into through holes of the printed board without soldering.

In the case when press-fitting this type of press-fit connector to a printed board, a comparatively large press-fitting force is required. In order to deal with this aspect, conventionally, a dedicated press-fitting device for each respective connector was provided along the assembly line of the printed board. This press-fit device comprises a storage section for storing one type of connector in a fixed orientation; a robot for transporting connectors one-by-one from the aforementioned storage section, and positioning these connectors in a mounting position on the printed board; a press machine for applying pressure to a connector placed on a printed board and press-fitting the connector pins into pin insertion apertures therein; and a support mechanism in contact with the lower face of the printed board at the mounting position for receiving the applied pressure force from the aforementioned press machine.

However, in the above-described conventional press-fitting device, due to insufficient fixing of the connector at the time of pressing, problems exist such as the potential bending of the connector pins which leads to insufficient reliability.

In addition, with regard to the aforementioned conventional press-fitting device, since one apparatus must be provided for each type of connector, in order to assemble one printed board, a large number of press-fitting devices are necessary, leading to high installation costs, as well as the need to secure a wide installation space for these aforementioned press-fitting devices. Furthermore, since a large number of the aforementioned press-fitting devices are cooperatively activated, not only is it difficult to increase the assembly speed, but also in the event that one device breaks down, the entire line must be halted, leading to problems such as reduction of the operational efficiency.

Furthermore, since it is difficult to control precisely the press-fitting amount of the connector, a space between the connector and printed board is often formed leading to connection failures, while the printed board is also susceptible to damage from an excessive amount of press-fitting.

Finally, in the case where it is necessary to mount a connector to the reverse side of the printed board, press-fitting must be conducted by reversing the printed board which results in poor productivity.

SUMMARY OF THE INVENTION

It is therefore an objective of the present invention to provide a connector press-fitting apparatus for precisely and efficiently mounting a connector on a printed board, and wherein a reduction of the facilities cost and equipment space is achieved.

In order to achieve the aforementioned objective, a connector press-fitting apparatus according to the present invention is provided comprising:

(a) a storing means for storing connectors;

(b) a positioning means for maintaining, moving, and positioning a printed board;

(c) a press-fitting head provided in an accessible and separable manner in the vertical direction with respect to said printed board maintained by said positioning means, and possessing a channel opening out into a surface facing said printed board;

(d) a head moving means for moving said press-fitting head in a vertical direction with respect to said printed board;

(e) a pressure-reducing means for affixing a connector to said press-fitting head by means of conducting pressure reduction of said channel of said press-fitting head;

(f) a transporting means for transporting connectors out from said storing means and delivering said connectors to said press-fitting head; and (g) a pressure-receiving means for supporting said printed board from a reverse face therein at the time of press-fitting a connector to said printed board by means of said press-fitting means.

According to this apparatus, initially a connector is transported from said storing means by said transporting means and delivered to said press-fitting head. The connector is then affixed to said press-fitting head by redundancy pressure in said channel of said press-fitting head. After the printed board is moved and positioned at a mounting position below said press-fitting head by said positioning means, the reverse face of said printed board is supported by said pressure-receiving means. Subsequently, said press-fitting head is lowered by said head moving means, and said connector is press-fitted at the mounting position of said printed board. In this manner, press-fitting is conducted with the connector affixed to the front tip of said press-fitting head, and thus the connector pins are press-fitted directly into the printed board. As a result, bending of the pins is prevented, and the reliability of the mounting operations is improved.

It is another objective of the present invention to reduce the equipment space and increase the productivity by press-fitting a plurality of various types of connectors using one apparatus.

In order to achieve this objective, a connector press-fitting apparatus according to an embodiment of the present invention is provided, wherein said storing means is capable of storing a plurality of various types of connectors. A plurality of various types of said press-fitting head and said pressure-receiving means are provided respectively corresponding to each type of said connector.

The connector press-fitting apparatus further comprises a switching means on a press-fitting side and a switching means on a pressure-receiving side for selecting a press-fitting head and pressure-receiving means corresponding to said connector to be press-fitted, and for arranging respectively said press-fitting head and said pressure-receiving means at a predetermined press-fitting position.

In this manner, the aforementioned objective can be achieved since a plurality of various types of connectors can be mounted by switching the press-fitting head and pressure-receiving means according to the aforementioned structure.

It is another objective of the present invention to control the amount of connector press-fitting corresponding to the high precision dispersion of the connector bottom wall thickness.

In order to achieve this objective, a connector press-fitting apparatus is provided according to another embodiment of the present invention, wherein said connector press-fitting apparatus further comprises:

an insertion block into which a connector on the surface of said transporting means can be inserted by said transporting means, which is employed in delivering a connector to said press-fitting head;

a thickness measuring means provided in said press-fitting head for measuring a bottom wall thickness of a connector at the time when said press-fitting head receives said connector inserted in said insertion block;

a press-fitting amount measuring means for measuring the press-fitting amount of a connector to said printed board at the time when said connector is press-fitted to said printed board by said press-fitting head; and a press-fitting amount control means for controlling said head moving means in a manner such that said press-fitting amount measured by said press-fitting amount measuring means equals a value corresponding to the bottom wall thickness measured by said thickness measuring means.

According to the aforementioned structure, after the wall thickness of the connector is measured with the connector inserted into the insertion block, the connector press-fitting amount is controlled based on this measured value. Thus, the occurrence of an insufficient or excessive connector press-fitting amount can be prevented.

It is an additional objective of the present invention to allow for the mounting of a connector on, not only the front face of a printed board, but also on the reverse face therein.

In order to achieve this objective, a connector press-fitting apparatus is provided according to another embodiment of the present invention, wherein said pressure-receiving means is a pressure-receiving head vertically provided in an accessible and separable manner with respect to said printed board; pin insertion apertures are formed corresponding to pins of a connector in a surface facing said printed board of said pressure-receiving head; and in an interior portion of said pressure receiving head, a channel is formed communicating with said pin insertion apertures;

said connector press-fitting apparatus further comprises:

a pressure-receiving head moving means for moving said pressure-receiving head in a vertical direction with respect to said printed board; and a second pressure-reducing means for affixing a connector to said pressure-receiving head by pressure reduction of said channel of said pressure-receiving head.

In addition, in said positioning means, a delivery passage is formed for allowing delivery of a connector from said press-fitting head to said pressure-receiving head, such that a connector is delivered to said pressure-receiving head from said press-fitting head by passing through this delivery passage;

According to the aforementioned structure, a connector is delivered from said press-fitting head to said pressure-receiving head via said delivery passage; said printed board is positioned at said press-fitting position by means of said positioning means; and said printed board and said connector are then sandwiched between said press-fitting head and said pressure-receiving head in a manner such that the mounting of said connector to a reverse face of said printed board is possible.

BRIEF DESCRIPTION OF THE DRAWINGS

FIG. 1 is a cross sectional view of the essential components showing a state in which a connector is press-fitted to a reverse face of a printed board.

DETAILED DESCRIPTION OF THE EMBODIMENTS

First Embodiment

Figure 1:
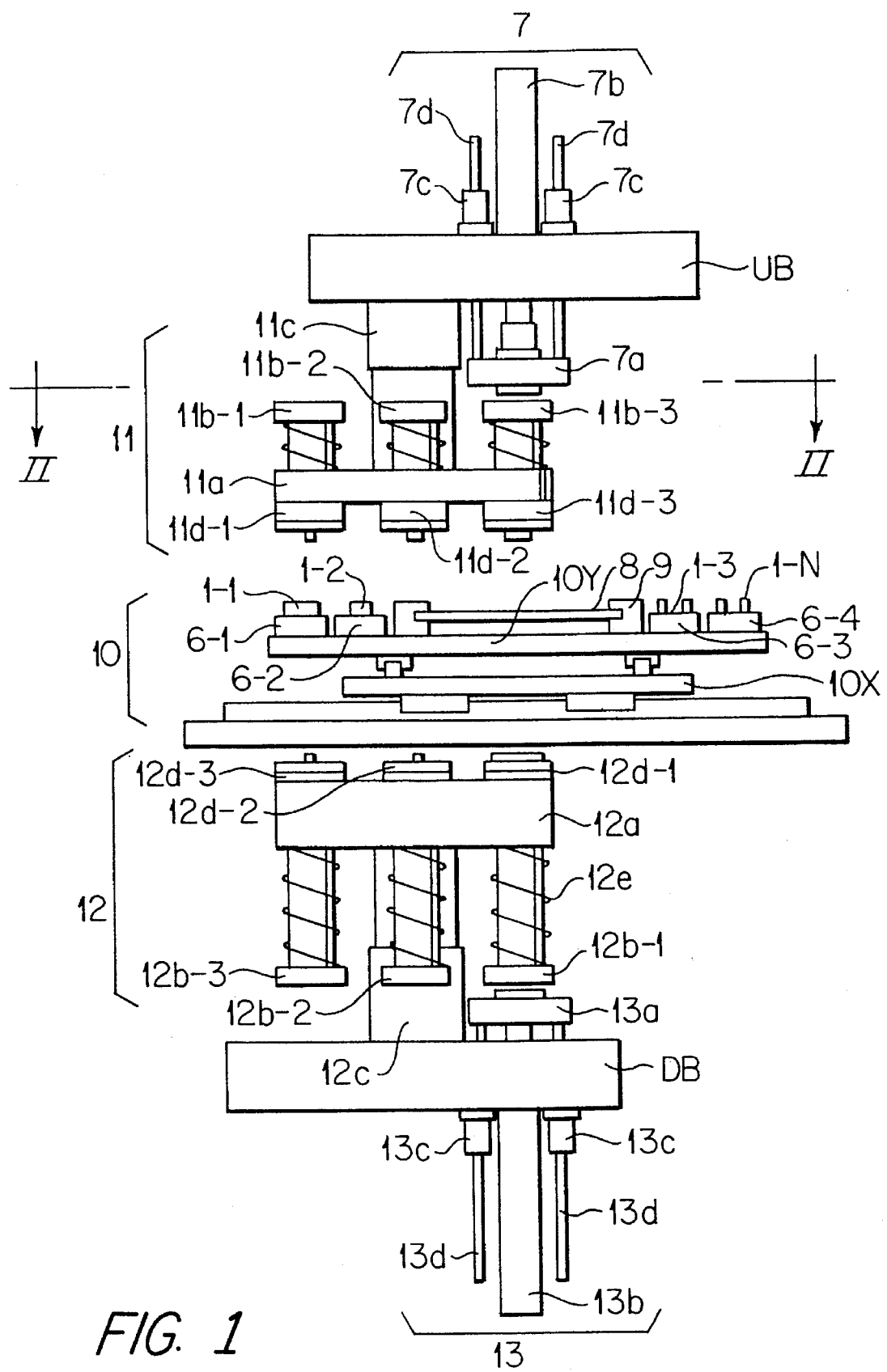
FIG. 1 is a front view showing a connector press-fitting apparatus according to a first embodiment of the present invention.

FIGS. 1–5 show a first embodiment of a connector press-fitting apparatus according to the present invention. FIG. 1 is a front view of this aforementioned embodiment. In the following description, a reference numeral such as "11$b$-3" in the figures represents a third component "11$b$".

The aforementioned apparatus possesses a NC moving table 10 which is arranged horizontally. As seen from FIG. 2, this NC moving table 10 comprises table 10Y, which is movable in the direction of the Y-axis, provided on top of table 10X, which is movable in the direction of the X-axis. On the upper face of table 10Y, a pair of holders 9 are provided. By means of these holders 9, printed board 8 to mount connector 1 is detachably supported in a horizontal manner.

Figure 2:
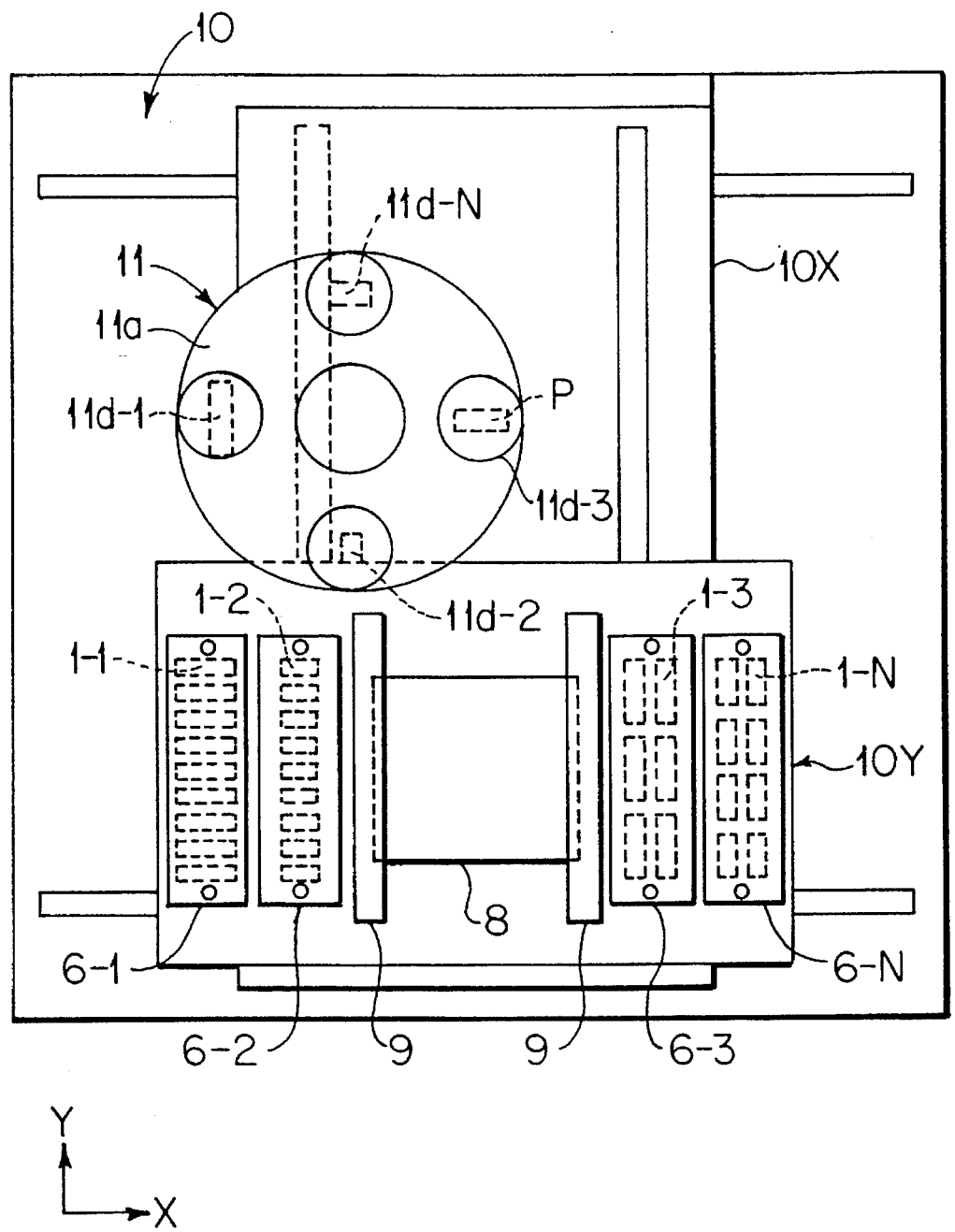
FIG. 2 is a real field of view along the line II—II of FIG. 1.

On table 10Y, two groups of trays (a total of four types of trays) 6-1–6-N are provided on each side of printed board 8, as shown in FIG. 2. In other words, in this embodiment, N=4; this example is common for all structures described below. In trays 6-1 and 6-2, connectors 1-1 and 1-2 are respectively stored longitudinally facing in the X-direction of NC moving table 10, while, in trays 6-3 and 6-N, connectors 1-3 and 1-N are stored longitudinally facing in the Y-direction of NC moving table 10. In this embodiment, connectors 1-1 and 1-3, and connectors 1-2 and 1-N are respectively the same type of connector. However, since their orientations therein are different from each other, these connectors are handled as different types of connectors. Needless to say, four types of connectors can be handled, so long as they have the same (common) orientation. The present invention is not, in particular, limited to the case in which N=4, as it is also possible, when necessary, to change N such that N=2, 3, 5, or more.

Press-fitting portion 7 is installed in upper base member UB, and possesses press-fitting block 7a in which a hollow channel is formed, and cylinder 7b for raising and lowering press-fitting block 7a. Press-fitting block 7a is supported by means of upper base member UB via guide 7c and guide shaft 7d in a position above the press-fitting position P shown in FIG. 2, in a manner such that upward and downward movement is possible.

Figure 3:
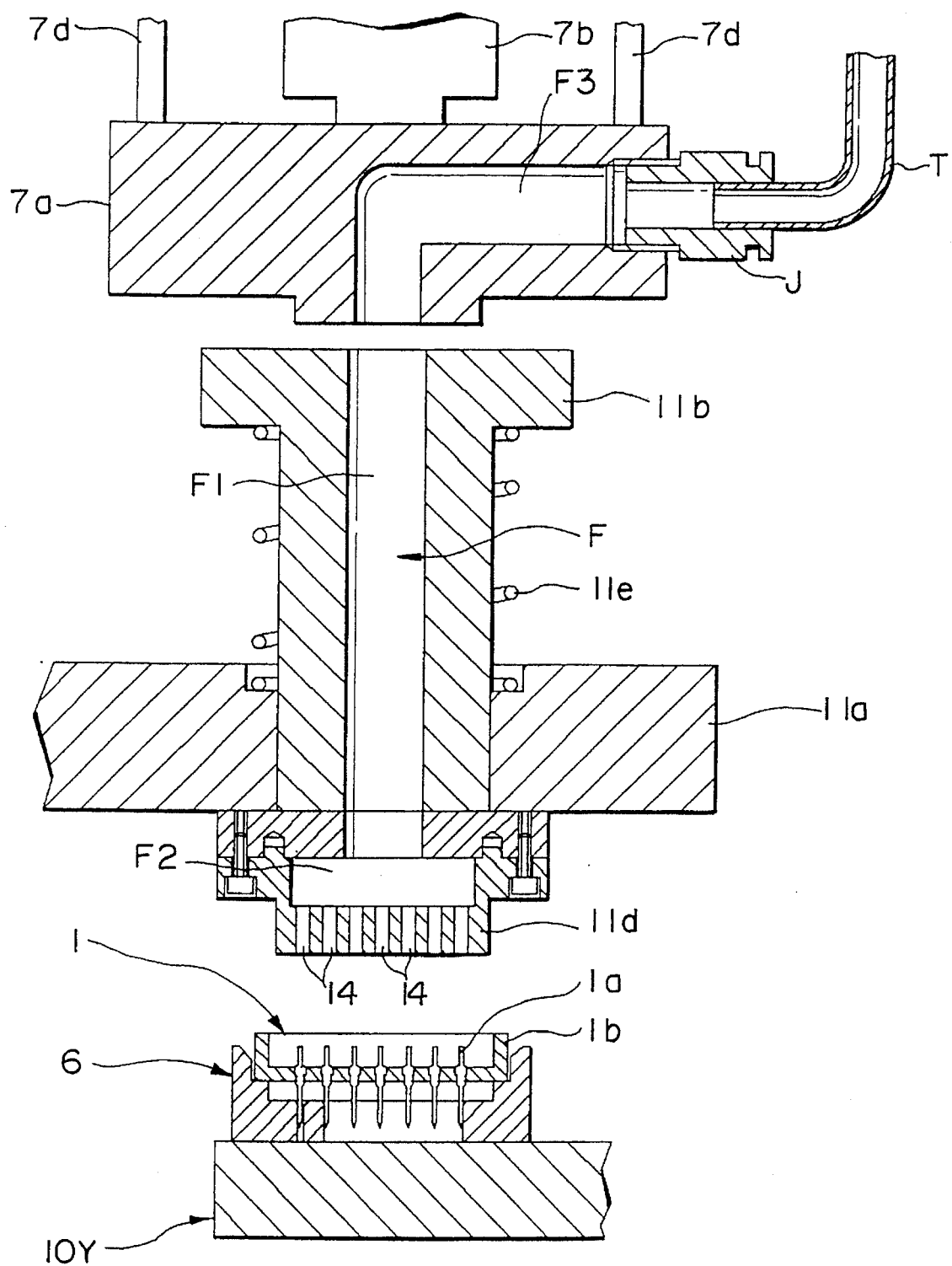
FIG. 3 is a cross sectional view of the essential components according to the first embodiment.

Press-fitting turret 11 comprises rotating table 11a possessing a circular shape and arranged horizontally, and driving motor 11c for rotating the aforementioned rotating table 11a. As shown in FIG. 1, a plurality of push rods 11b-1–11b-N are vertically installed penetrating through rotating table 11a (FIG. 2) with equal intervals formed in a circumferential manner thereinbetween on the periphery of rotating table 11a. One of these aforementioned rods is positioned above the press-fitting position P shown in FIG. 2. Each of push rods 11b1–11b-N is biased above rotating table 11a, respectively, by means of coil springs 11e, as shown in FIG. 3. In the interior portion of each push rod 11b, a hollow channel F1 is formed as shown in FIG. 3.

A press-fitting head 11d-1–11d-N is respectively installed at the lower end of each push rod 11b. At the bottom end of each press-fitting head 11d-1– 11d-N, an engaging member possessing a shape conforming to the shape and pin arrangement of connectors 1-1–1-N, is respectively formed. When moved into press-fitting position P, each of these engaging members can engage a corresponding connector 1. In other words, when moved into press-fitting position P, the engaging member of press-fitting head 11d-2 and 11d-3 is designed such that engagement with connectors 1-2 and 1-3, extending in the X-direction of NC moving table 10, is possible. In the same manner, when moved into press-fitting position P, the engaging member of press-fitting heads 11d-1 and 11d-N is designed such that engagement with connectors 11-a and 11-N, extending in the Y-direction of NC moving table 10, is possible.

As shown in FIG. 3, connector 1 which is stored in tray 6 is formed from a plurality of pins 1a arranged in a plurality of lines, and housing 1b supporting these aforementioned pins 1a. The upper end of each pin 1a is insertable into a punch hole 14 formed respectively in each engaging member of each press-fitting head 11d. In each press-fitting head 11d, a hollow channel F2 is formed communicating with hollow channel F1, as well as each punch hole 14.

In the interior of press-fitting block 7a, a hollow channel F3 is formed; one end of this hollow channel F3 opens to the lower face of press-fitting block 7a. In this manner, when the bottom end of press-fitting block 7a comes into contact with the top end of push rod 11b, hollow channels F1, F2, and F3, and punch holes 14 communicate to form channel F. The other end of hollow channel F3 is connected to tube T via a joint J installed on the side face of press-fitting block 7a. A vacuum pump and pressure pump (not shown in the figures) are connected to the aforementioned tube T via a valve (not shown in the figures). By means of decompressing (pressure reduction) or pressurizing the interior of channel F using these aforementioned pumps, connector 1 can be affixed to or separated from the engaging member of a press-fitting head 11d.

As shown in FIG. 1, pressure-receiving turret 12 and pressure-receiving portion 13 are provided below NC moving table 10. Pressure-receiving turret 12 possesses circular rotating table 12a arranged horizontally, and driving motor 12c for rotating the aforementioned rotating table 12a. A plurality of push rods 12b-1–12b-N are supported penetrating through rotating table 12a in a manner such that upward/downward movement is possible, with equal intervals formed in a circumferential manner thereinbetween on the periphery of rotating table 12a. One of these push rods 12b is positioned below press-fitting position P shown in FIG. 2. Each of these aforementioned push rods 12b-1 –12b-N is biased below rotating table 12a by means of respective coil springs 12e. At the upper end of each push rod 12b, a pressure-receiving head 12d-1 12d-N is respectively installed. In this manner, when pressure-receiving portion 13 pushes upward against push rod 12b positioned at press-fitting position P, the pressure-receiving head 12d of this push rod 12b comes into contact with the lower surface of printed board 8. Furthermore, a set of openings (not shown in the figures) are respectively formed in tables 10X and 10Y through which push rods 12b may pass.

In each of pressure-receiving heads 12d-1–12d-N, punch holes (not shown in the figures) are respectively formed into which the bottom ends of the pins of corresponding connectors 1-1–1-N are inserted. In this manner, during connector press-fitting, the bottom ends of the aforementioned pins protruding through printed board 8 are designed to be received by the punch holes of pressure-receiving head 12d.

Pressure-receiving portion 13 is provided for pushing push rod 12b positioned at press-fitting fixed position P, and comprises pressure-receiving block 13a arranged below press-fitting fixed position P, and cylinder 13b for raising and lowering this aforementioned pressure-receiving block 13a. Cylinder 13b is fixed vertically into lower base member DB. Pressure-receiving block 13a is installed into lower base member DB via guide 13c and guide shaft 13d in a manner such that upward/downward movement is possible, and further, communicates to the rod of cylinder 13b. When pressure-receiving block 13a is raised upwards by means of cylinder 13b, the push rod 12b positioned at press-fitting position P is designed to be pushed upwards.

Figure 4:
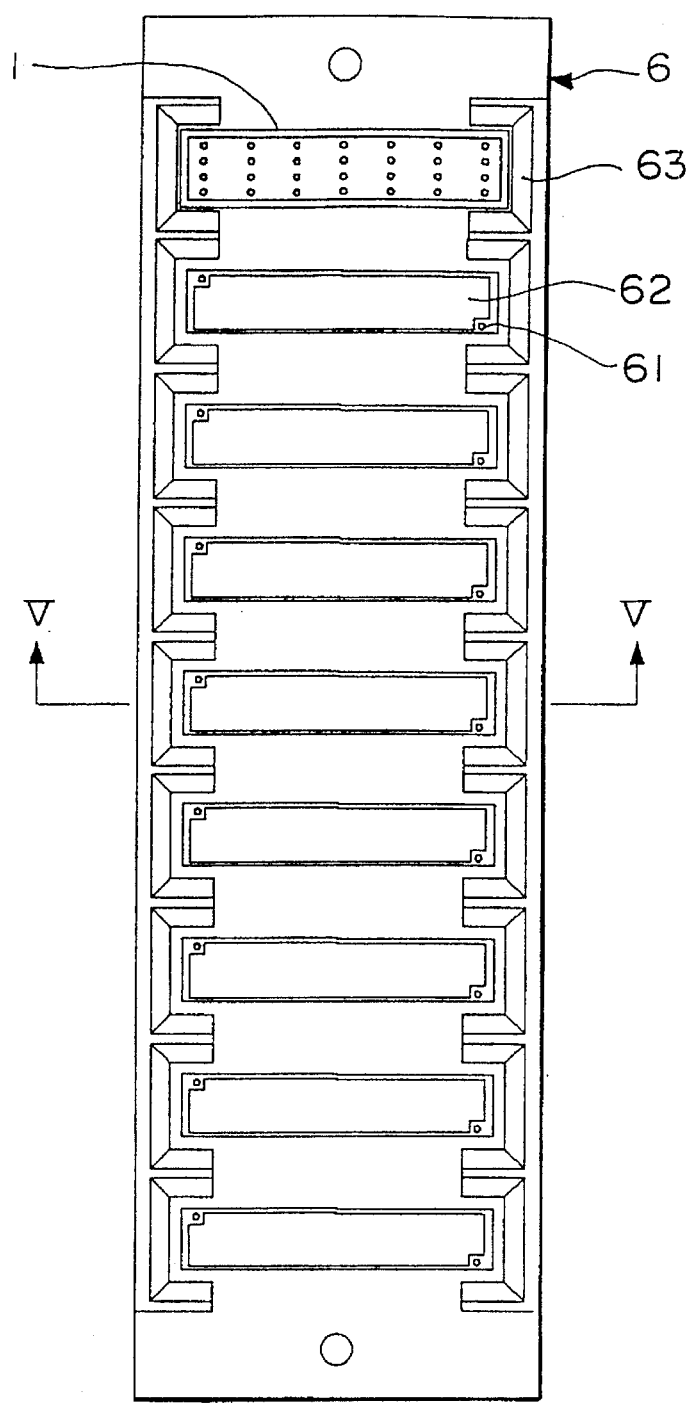
FIG. 4 is a plane view of a tray.
Figure 5:
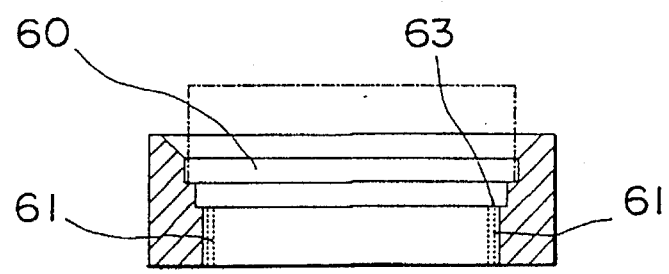
FIG. 5 is a cross sectional view along the line V—V of FIG. 4.

FIG. 4 is a plane view showing an example of a tray 6; FIG. 5 is a cross section of FIG. 4. In tray 6, a plurality of concave portions 60 (in this example, nine concave portions are provided) are formed; a connector 1 can be stored in each of these aforementioned concave portions 60. In the bottom of concave portion 60, a pair of insertion apertures 61 and recess apertures 62 are respectively formed. A pair of pins positioned at the diagonal positions of connector 1 are inserted into the aforementioned insertion apertures 61; in this manner, insertion apertures 61 positions connector 1. Recess apertures 62 are formed for storing pins other than the aforementioned two pins for positioning in a manner such that these pins do not interfere with tray 6. At the upper portion of the interior wall face of concave portion 60, a tapered surface 63 extending in the upward direction is formed such that connector storage to concave portion 60 can be easily accomplished.

NC moving table 10, driving motor 11c, and driving motor 12c are connected to a computer or the like, not shown in the figures; a control mechanism is built into this computer which, based on a previously inputted procedure, generates a first directive for specifying the type of connector; a second directive for specifying the mounting position on the printed board at which the aforementioned connector is to be press-fitted; and a third directive for specifying the placement position of this connector on NC moving table 10 at a predetermined timing. Cylinders 7b and 13b are connected to the supply source of a pressure fluid via a switch valve (not shown in the figures). This switch valve is controlled by the aforementioned control mechanism.

When using the connector press-fitting apparatus comprising the above-described structure, by means of the control mechanism, a first directive for specifying the type of connector 1, a second directive for specifying the mounting position of the connector 1 on printed board 8, and a third directive for specifying the placement position of connector 1 on table 10Y are initially generated. The third directive is determined from the type of connector and number of connectors remaining in tray 6.

NC moving table 10 initially moves the connector placement position specified by means of the third directive to press-fitting position P, or moves the specified connector placement position to a delivery position other than press-fitting position P.

In parallel with the aforementioned table movement, press-fitting turret 11 moves press-fitting head 11d corresponding to the specified connector 1 to press-fitting position P based on the first directive, or moves this press-fitting head 11d to a delivery position other than the press-fitting position P. When the specified connector 1 arrives at the press-fitting position P (or at delivery position), press-fitting block 7a is lowered by means of cylinder 7b of press-fitting portion 7. In this manner, the aforementioned press-fitting block 7a pushes push rod 11b downward against the elastic force of coil spring 11e, thereby fitting the engaging member of press-fitting head 11d into the specified connector 1. Subsequently, by means of pressure reduction of channel F, connector 1 is affixed to an engaging member, press-fitting block 7a is raised by means of cylinder 7b, and connector 1 is lifted from tray 6. In the case when the delivery position is different from press-fitting position P, the affixed connector 1 is moved to press-fitting position P after conducting the aforementioned actions.

In the meantime, pressure-receiving turret 12, paralleling the movement of the aforementioned table, selects the pressure-receiving head 12d corresponding to the connector 1 specified by means of the first directive, and moves this pressure receiving head to press-fitting position P.

Press-fitting block 7a is then lowered by means of cylinder 7b, thereby pushing press-fitting head 11d downward and press-fitting connector 1 affixed thereon at the mounting position on printed board 8. On the other hand, push rod 12b is pushed upwards by means of cylinder 13b of pressure receiving portion 13, thereby pressure-welding pressure-receiving head 12d to the reverse face of the mounting position of printed board 8 to support the load from press-fitting. In this manner, the pins of connector 1 penetrate through the through holes of printed board 8 and are received by the punch holes of pressure-receiving head 12d to reliably mount connector 1 on printed board 8.

After mounting connector 1, pressure reduction of channel F is ceased, and connector 1 is separated from press-fitting head 11d by pressurizing channel F to greater than atmospheric pressure if necessary. In addition, press-fitting head 7d is raised, pressure-receiving head 12d is lowered, and the aforementioned procedure for mounting the next connector 1 is then repeated.

In this type of connector press-fitting apparatus according to the first embodiment, a plurality of types of trays 6, press-fitting heads 11d, and pressure-receiving heads 12d are respectively provided corresponding to the types of connectors 1. Press-fitting is carried out by means of selecting appropriate member corresponding to connector 1 to be press-fitted from the among the aforementioned based on the first through third directives generated by means of the control mechanism; thus a plurality of connectors 1 can be efficiently press-fitted using an optional procedure by means of one apparatus, thereby improving the overall efficiency of the connector press-fitting operation. In addition, as mentioned above, same type of connector 1 with a different press-fitting orientation with respect to printed board 8 can be dealt with by means of handling this connector 1 as a different type of connector.

Furthermore, according to the first embodiment, all connectors 1 are housed in the trays 6 on NC moving table 10; thus, when compared to, for example, a structure in which the stocker of the connectors is provided separately from NC moving table wherein mounting is conducted by withdrawing the connectors from this stocker one-by-one, the installation space of the entire apparatus can be reduced and the manufacturing costs of the apparatus can be decreased. In addition, other advantages exist such as simplification of the operation of the apparatus, reduction of the transportation time of each connector 1, and an overall decrease in accidents due to the reduced number of delivery positions of connector 1.

Furthermore, the present invention is not limited to a structure equipped with a press-fitting turret 11 and pressure-receiving turret 12 as in the aforementioned first embodiment. A structure lacking the aforementioned press-fitting turret and pressure-receiving turret as disclosed in Japanese Patent Application, No. Hei 5-32611 previously filed by the applicants of the present invention, can also be appropriately applied.

Second Embodiment

A connector press-fitting apparatus according to a second embodiment of the present invention will be described using FIGS. 6–10. Furthermore, components similar to those described in the first embodiment will be represented by the same numerals and their explanations will be omitted.

The greatest point of difference between this second embodiment and the first embodiment lies in the installation of a stocker 2 which can store a plurality of connectors 1. In other words, according to the first embodiment, a plurality of trays 6 storing a comparatively small number of connectors 1 were placed on table 10, and these connectors 1 stored therein were transported from these trays to printed board 8. Hence, the storage amount of connectors 1 was comparatively small. In contrast, according to the second embodiment, a stocker 2 storing a plurality of various types of connectors 1 is arranged on the side of NC moving table 10, and these aforementioned connectors 1 are held and transported all at once from stocker 2 to insertion block 15 on table 10Y by means of transporting portion 3. Furthermore, the connectors 1 are affixed by press-fitting turret 11 and then transported from insertion block 15 to the surface of printed board 8. Press-fitting is then conducted in the same manner as in the first embodiment. In this manner, an advantage is gained in that the storage amount of connectors can be increased.

Figure 6:
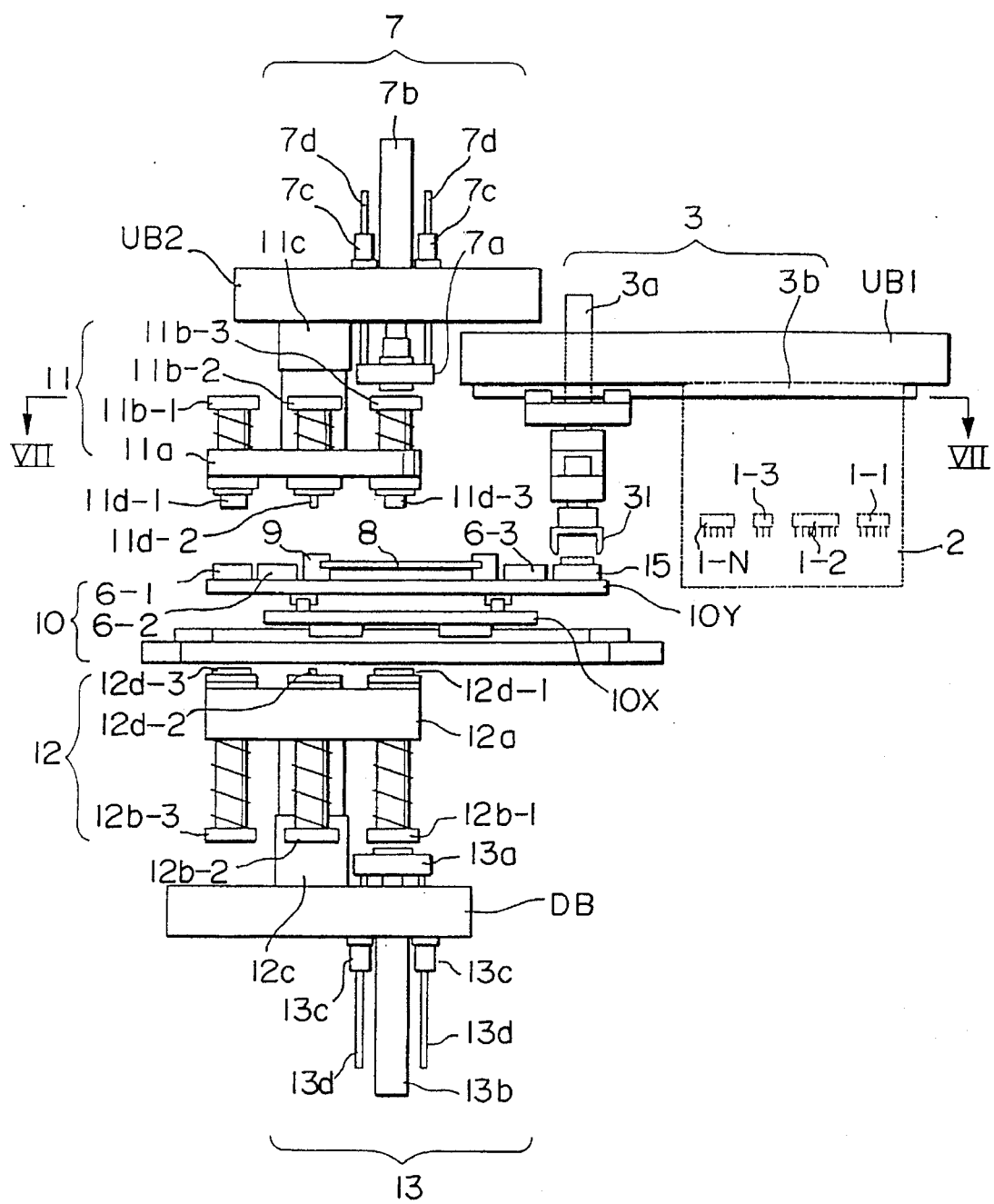
FIG. 6 is a front view showing a connector press-fitting apparatus according to a second embodiment of the present invention.
Figure 7:
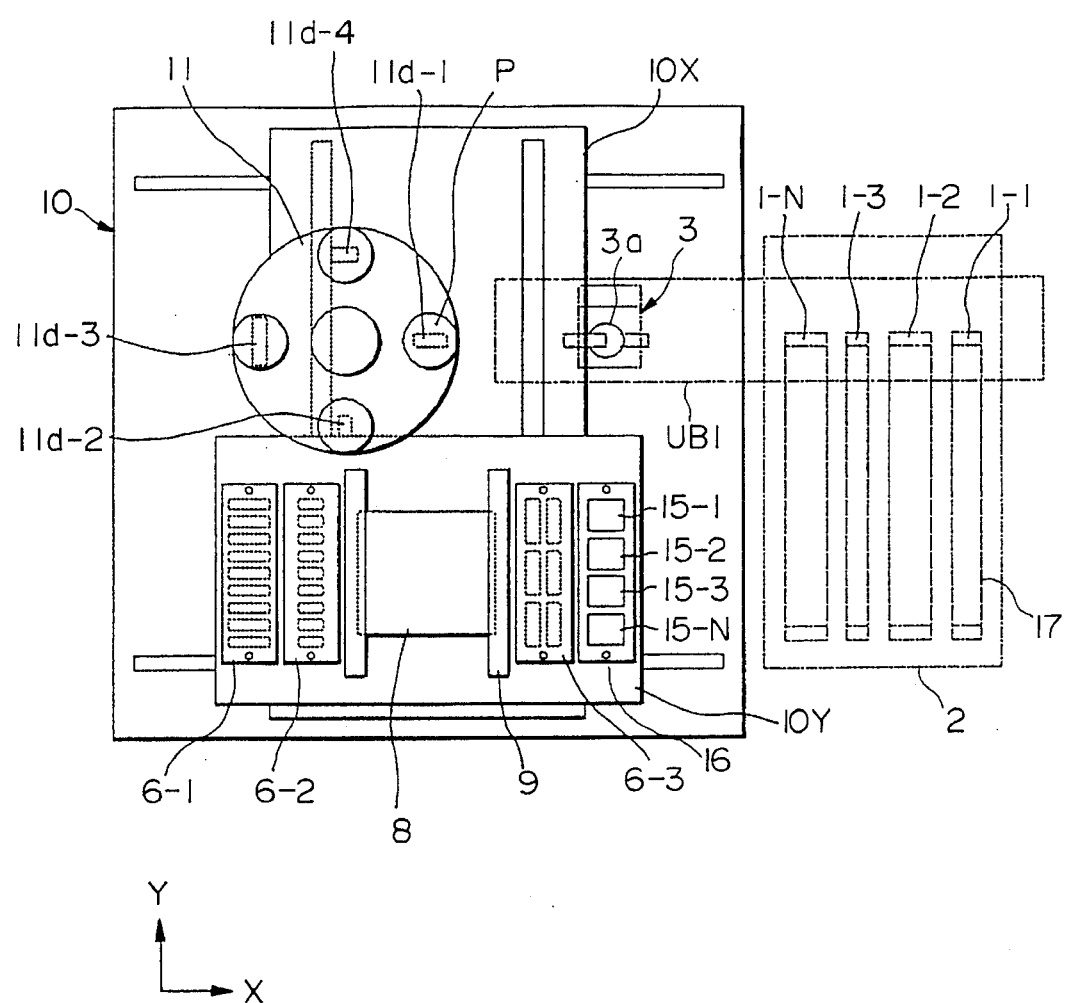
FIG. 7 shows a real field of view along the line VII—VII of FIG. 6.

As shown in FIG. 7, stocker 2 possesses different slender magazine cases 17, each storing a plurality of one type of connector 1-1~1-N. Each of these aforementioned magazine cases 17 is designed such that connectors 1 can be sequentially withdrawn from one end therein by means of transporting portion 3. Furthermore, in the aforementioned figures, N=4; however, it is also possible to change N in a manner such that N=2, 3, 5, or more. Transporting portion 3, as shown in FIG. 6, possesses grasping mechanism 3a capable of rotation as well as upward/downward movement, and transporting mechanism 3b for transporting this grasping mechanism 3a in the horizontal direction. A chuck 31 is provided at the lower end of grasping mechanism 3a for grasping and fixing a connector 1. As shown in FIG. 6, transported portion 3 is installed in a first upper base member UB1, while press-fitting portion 7 is installed in a second upper base member UB2.

As shown in FIG. 7, tray 6-3 and four types of insertion blocks 15-1~15-N are arranged on table 10Y of NC moving table 10 closer to stocker 2 than printed board 8. In addition, on the opposite side of printed board 8, trays 6-1 and 6-2 are arranged respectively on table 10Y. Trays 6-1, 6-2, and 6-3 are identical to tray 6 of the first embodiment shown in FIGS. 4 and 5, and pre-store different types of connectors 1-1~1-3. When the connectors 1 inside stocker 2 are exhausted, a reserve supply of connectors is sent to stocker 2 while using the connectors 1 of these aforementioned trays 6. In the example shown in the Figures, three types of trays 6 are shown; however, it is also possible to provide four or more types of trays as well.

Insertion blocks 15-1~15-N are provided for keeping separate the different types of connectors 1-1~1-N transported from stocker 2 by means of transporting portion 3. Since the present apparatus is provided with four types of insertion blocks 15, this apparatus can handle at most four types of connectors 1. In a similar manner to the first embodiment, identical connectors 1 with different press-fitting orientations on printed board 8 can be dealt with by handling these connectors as different types of connectors.

Figure 8:
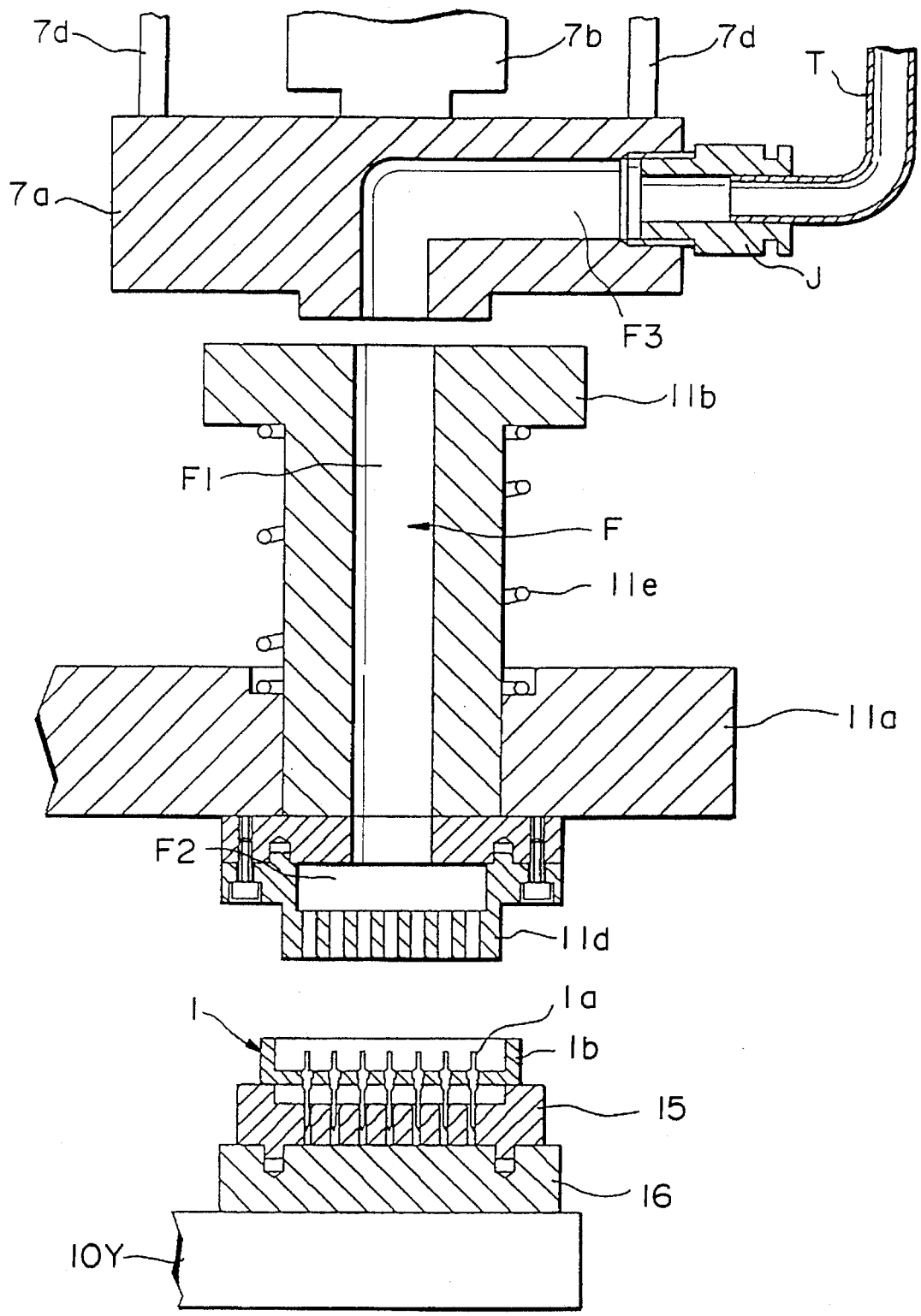
FIG. 8 is a cross sectional view showing the essential components according to the second embodiment.
Figure 9:
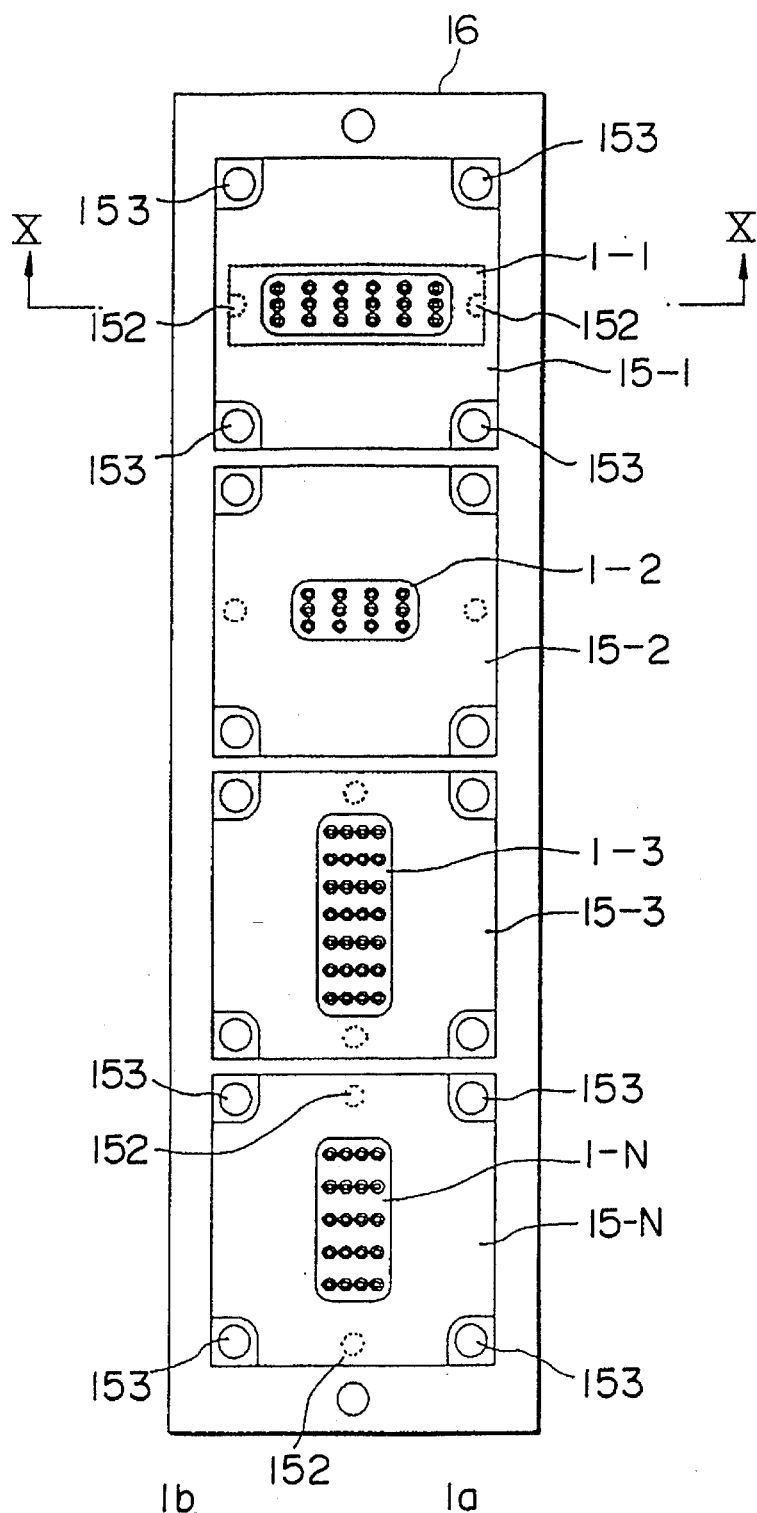
FIG. 9 is a plane view of an insertion block.
Figure 10:
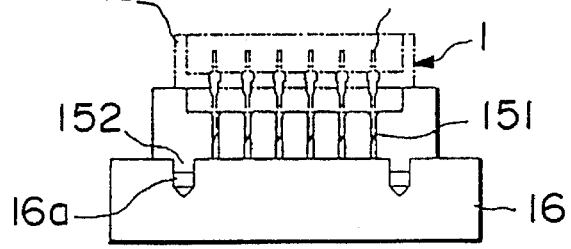
FIG. 10 is a cross sectional view taken along the line X—X of FIG. 9.

As shown in FIGS. 8~10, insertion block 15 is installed on table 10Y via base 16. As shown in FIG. 9, aperture 153 is formed in each of the four corners of each insertion block 15. Insertion block 15 is fixed to base 16 through these apertures 153 by means of bolts (not shown in the figures). As shown in FIGS. 8 and 10, a pair of bosses 152 are formed in the longitudinal direction along the extended line of connector 1. In addition, two pairs of fixed apertures 16a (four total apertures) are formed in the upper face of base 16 such that one pair of fixed apertures 16a is rotated 90° with respect to the other pair. Each insertion block 15 is positioned on base 16A by means of selecting two of these aforementioned apertures 16A and engaging boss 152 thereto in a manner such that the orientation can be changed every 90°.

On the upper face of insertion block 15, pin insertion apertures 151 are formed, respectively, into which the lower end portions of pins 1a of connector 1 are inserted. The opening of each pin insertion aperture 151 is tapered in a manner such that the insertion of pin 1a can be easily accomplished. The arrangement of pin insertion apertures 151 is identical to the pin arrangement of connector 1. The minor diameter of a pin insertion aperture 151 is formed larger than the major diameter of pin 1a, e.g., 0.2 mm larger. The connector 1 is positioned with respect to insertion block 15 by means of inserting pins 1a into pin insertion apertures 151, respectively.

The support height of connector 1 on the upper face of insertion block 15 is preferably set to the same support height at the time of inserting connector 1 into printed board 8 on NC moving table 10. This is to minimize the strokes of press-fitting portion 7, and to prevent degradation of the mechanical precision from reduction and/or distortion of the cycle time.

When employing the connector press-fitting apparatus formed from the above-described structure according to the second embodiment, a first directive specifying the type of connector 1, and a second directive specifying the mounting position of connector 1 on printed board 8 are generated by means of the control mechanism. The transporting portion 3, based on the first directive, operates grasping mechanism 3a, and after the specified connector 1 has been grasped and raised from magazine 7 inside stocker 2, transports this connector 1 to an insertion position for insertion into insertion block 15. In the meantime, table 10Y is operated according to the first directive, and the corresponding insertion block 15 is moved to the aforementioned insertion position. Connector 1 is then lowered by means of grasping mechanism 3a and engaged into insertion block 15. Grasping mechanism 3a possesses a function for rotating the held connector 1, and thus this grasping mechanism 3a can insert a connector 1 into an insertion block 15 at any optional orientation.

Subsequently, table 10Y is moved according to a directive from the control mechanism, and the insertion block 15 on which the connector 1 to be mounted is placed, is moved to press-fitting position P. Based on the first directive, press-fitting turret 11 selects a press-fitting head 11d corresponding to connector 1 and rotates this press-fitting head 11d to press-fitting position P. Subsequently, press-fitting block 7a is lowered by means of cylinder 7b of press-fitting portion 7, and the engaging member of press-fitting head 11d is engaged with connector 1. By reducing the pressure in channel F shown in FIG. 8, connector 1 is then affixed to the aforementioned engaging member. Furthermore, press-fitting block 7a is then raised by means of cylinder 7b, and connector 1 is lifted from insertion block 15.

According to the second directive, the connector mounting position on printed board 8 is positioned at press-fitting position P, and together with this, a pressure-receiving head 12d corresponding to connector 1 is selected based on the first directive and rotated to press-fitting position P. Subsequently, press-fitting block 7a is lowered by means of cylinder 7b, press-fitting head 11d is pushed downwards, and the pins of connector 1 affixed therein are press-fitted into the pin apertures formed at the mounting position on printed board 8. Push rod 12b is then pushed upward by means of cylinder 13b of pressure-receiving portion 13, and thereby forcing pressure-receiving head 12d against the reverse face of printed board 8 at the mounting position to support the press-fitting load. In this manner, the pins of connector 1 pass through the through holes of printed plate 8 and are received by means of the punch holes of pressure-receiving head 12d. As a result, connector 1 is mounted reliably on printed board 8.

After mounting connector 1, pressure reduction of channel F is ceased, and connector 1 is separated from press-fitting head 11d by pressurizing channel F to greater than atmospheric pressure if necessary. Furthermore, press-fitting head 11d is raised, pressure-receiving head 12d is lowered, and the aforementioned procedure is then repeated in the mounting of the next connector 1. When the connectors 1 in magazines 7 of stocker 2 are exhausted, instead of taking connectors 1 from magazine 7, connectors 1 are transported from tray 6 of table 10Y and employed. This operation is similar to that of the apparatus described in the first embodiment, and thus the related explanation will be omitted. While employing the connectors 1 from inside trays 6, supplemental connectors 1 can be supplied to stocker 2 without stopping the operation of the apparatus.

Therefore, according to a connector press-fitting apparatus of the aforementioned structure of the second embodiment, it is possible to efficiently press-fit a plurality of various types of connectors 1 in an optional sequence by means of using only one apparatus. In this manner, the efficiency of the connector press-fitting operation can be improved. Furthermore, when compared to the first embodiment, the storage capacity of connectors 1 can be increased since a structure is realized in which connectors 1 are transported to a stocker 2.

Third Embodiment

A connector press-fitting apparatus according to the third embodiment of the present invention will be described using FIGS. 11~14. Furthermore, components similar to those described in the aforementioned first and second embodiments will be denoted by the same numerals, and their explanations will be omitted.

This third embodiment differs from the above-described first and second embodiments in that mechanisms 35 and 38 are provided for appropriately controlling the connector press-fitting amount. As shown in FIG. 12, a dispersion of ±0.2 mm from the forming error exists in the bottom wall thickness T of housing 1b of connector 1. In a similar manner, a dispersion of ±0.3 mm exists with respect to the rod-lowering amount of cylinder 7b of press-fitting portion 7 shown in FIG. 11 in order to be controlled by means of the supplied amount of oil therein. Consequently, when these errors accumulate, it is possible for a maximum space of 0.5 mm to be opened between printed board 8 and connector 1. In general, the permissible range of this space between printed board 8 and connector 1 is 0.1~0.3 mm. In the case when the aforementioned space exceed this permissible range, contact defects are generated between pin 1a and through hole 8a (see FIG. 13). When excessive pressure is exerted on connector 1 with respect to printed board 8, there exists substantial risk of damage to the through holes 8a and pattern of printed board 8. In the press-fitting portion 7 shown in FIG. 11, a press-fitting force to through hole 8a of, for example, 20 kgf per pin is required. Consequently, when a connector of 100 pins is press-fitted, a compression force of approximately 2 tons is applied to printed board 8 which could potentially affect the quality of the product. According to this third embodiment, the aforementioned contact defects of the connector, as well as damage to the printed board are prevented by means of normally controlling the space between printed board 8 and connector 1 in a uniform manner.

Figure 11:
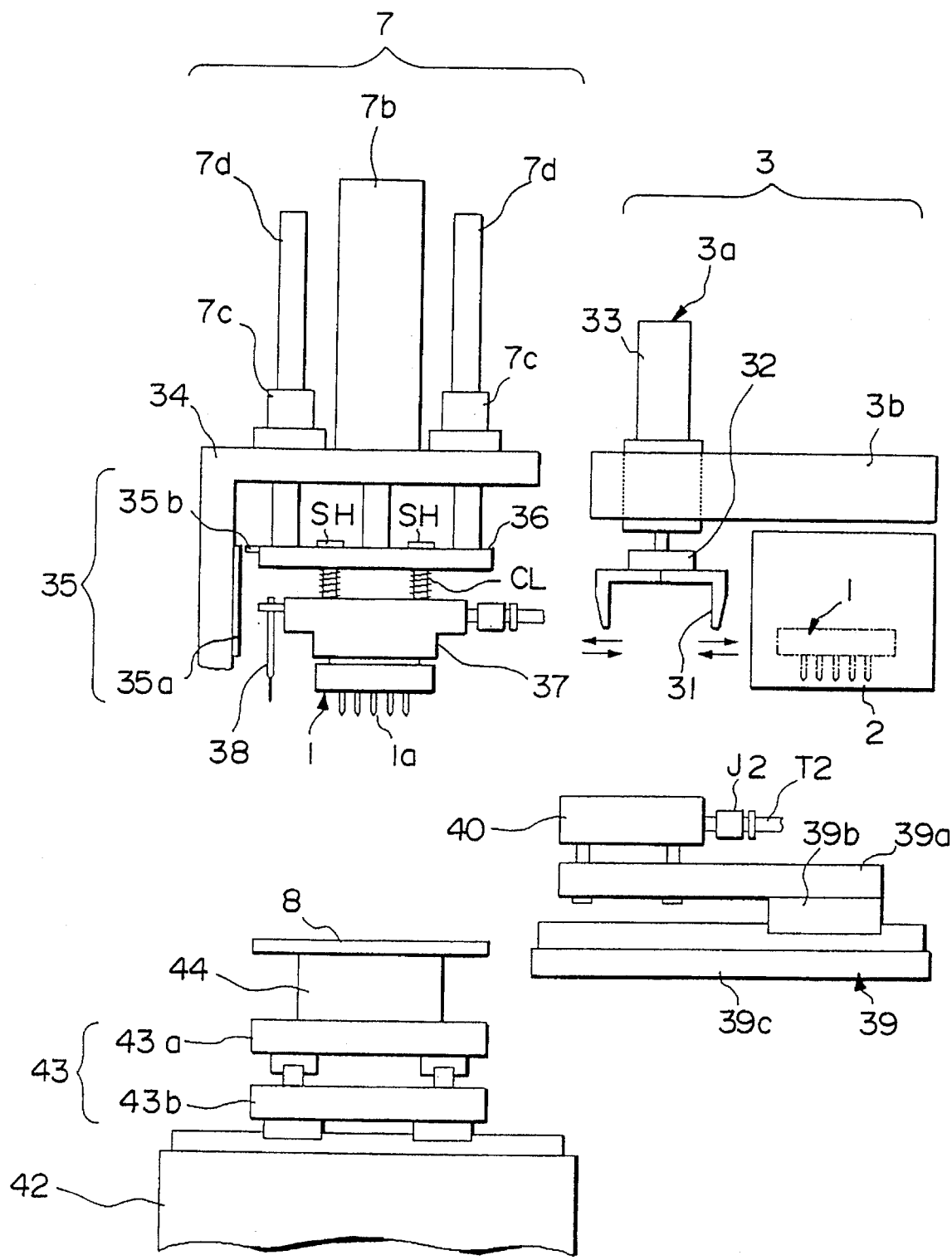
FIG. 11 is a front view showing a connector press-fitting apparatus according to a third embodiment of the present invention.
Figure 12:
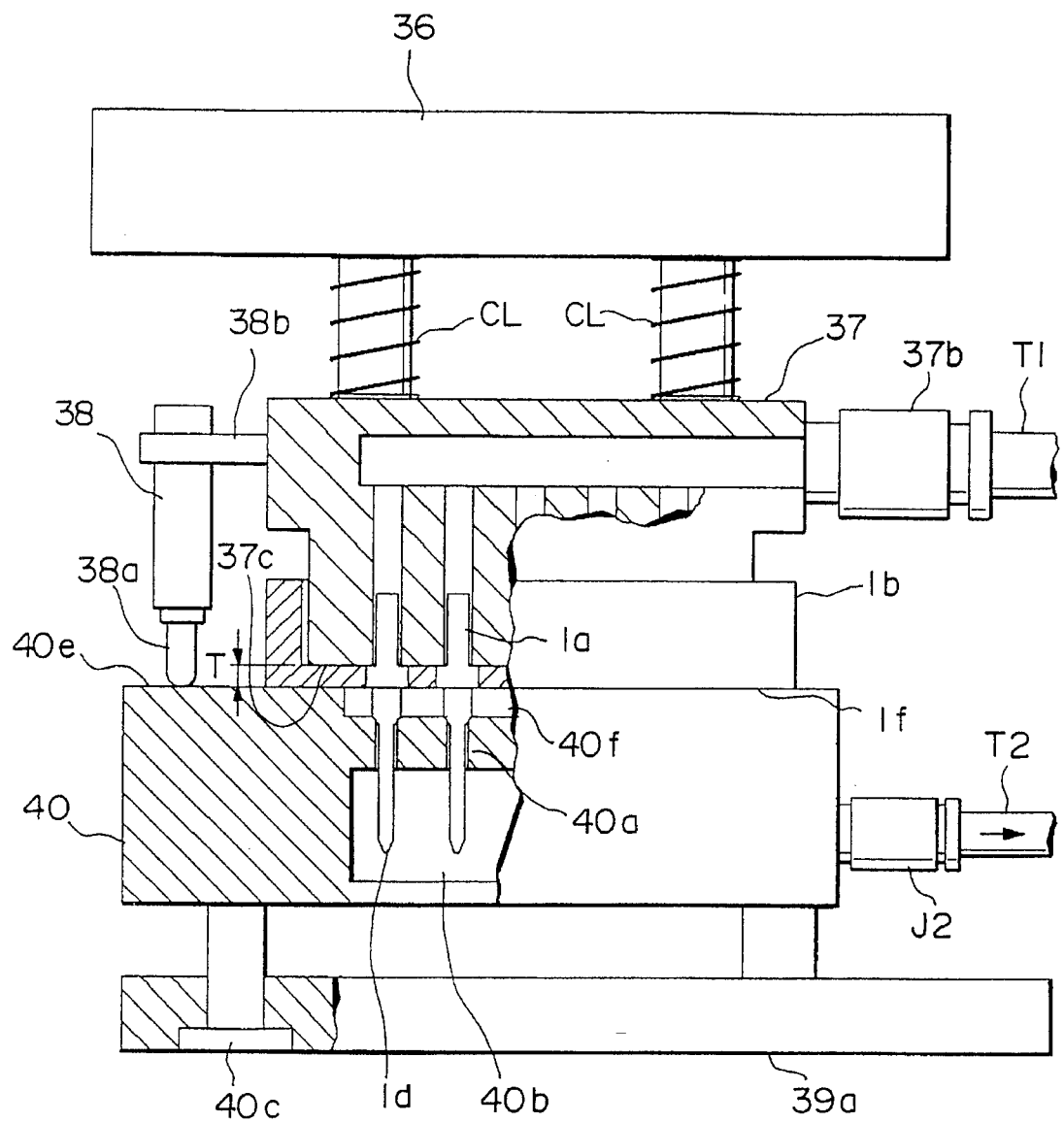
FIG. 12 is a cross sectional view of the essential components in a state of measuring the connector bottom wall thickness.

FIG. 11 is a front view showing an apparatus according to the third embodiment. This apparatus comprises a stocker 2 for storing and maintaining a plurality of connectors 1 in magazine cases; transporting portion 3 for transporting connectors 1 out from stocker 2; insertion block 40 for receiving connectors 1 from the aforementioned transporting portion 3; press-fitting portion 7 for affixing and press-fitting to printed board 8 connectors 1 placed on insertion block 40; and NC moving table 43 for supporting printed board 8.

Transporting portion 3 comprises grasping mechanism 3a and transporting mechanism 3b; grasping mechanism 3a is formed from chuck 31, floating mechanism 32 for supporting chuck 31, and cylinder 33 for raising/lowering floating mechanism 32. Transporting mechanism 3b is provided for moving grasping mechanism 3a horizontally between stocker 2 and insertion block 40. In this manner, connectors 1 can be placed on insertion block 40 by means of transporting portion 4 which transports these connectors 1 from stocker 2.

Insertion block 40 is fixed to bottom plate 39a of transferring mechanism 39. Transferring mechanism 39 is a mechanism for moving bottom plate 39a along mounting guide 39c by means of slide rail 39b. In this manner, insertion block 40 can be moved from a position facing grasping mechanism 3a to a position facing press-fitting head 37. As shown in FIG. 12, hollow section 40b is formed in the inner portion of insertion block 40. This hollow section 40b is connected to a vacuum pump (not shown in the figures) via joint J2 and tube T2. On the upper face of insertion block 40, pin insertion apertures 40a corresponding the arrangement of the pins 1a of connector 1 are formed communicating to the aforementioned hollow section 40b. The upper ends of pin insertion apertures 40a are respectively tapered. The opening diameter of each pin insertion aperture 40a is formed greater than the thickness of tip portion 1d of pin 1a, and narrower than base end 1e.

As shown in FIG. 11, press-fitting portion 7 possesses press-fitting block 36 which is capable of upward/downward movement, and cylinder 7b for raising/lowering the aforementioned. Press-fitting block 36 is installed in base member 34 via guide 7c and guide shaft 7d. Similarly, cylinder 7b is also installed in base member 34. As cylinder 7b, in order to generate a sufficient force to press-fit connector 1 on printed board 8, use of a high pressure hydraulic cylinder is preferred.

Base member 34 possesses an L-shape to which a magnet scale 35a for measuring the displacement amount is fixed facing in the upward/downward direction on a vertical side face therein. Magnet scale 35a forms a magnetic graduation aligned in the longitudinal direction. Commercially-available magnet scales possess a resolution of approximately 10 μm. Consequently, it is possible to control the amount which press-fitting head 37 falls or the amount which this press-fitting head 37 rises using this same resolution. On a side face of press-fitting block 36, a magnetic head 35b is installed facing magnet scale 35a which can measure the displacement of press-fitting block 36 using magnet scale 35a as a standard. The aforementioned magnet scale 35a and magnetic head 35b form a linear scale 35. If hydraulic cylinder 7b is controlled by means of a hydraulic servo (not shown in the figures), the movement amount of press-fitting head 37 can be controlled at an even higher precision.

Figure 13:
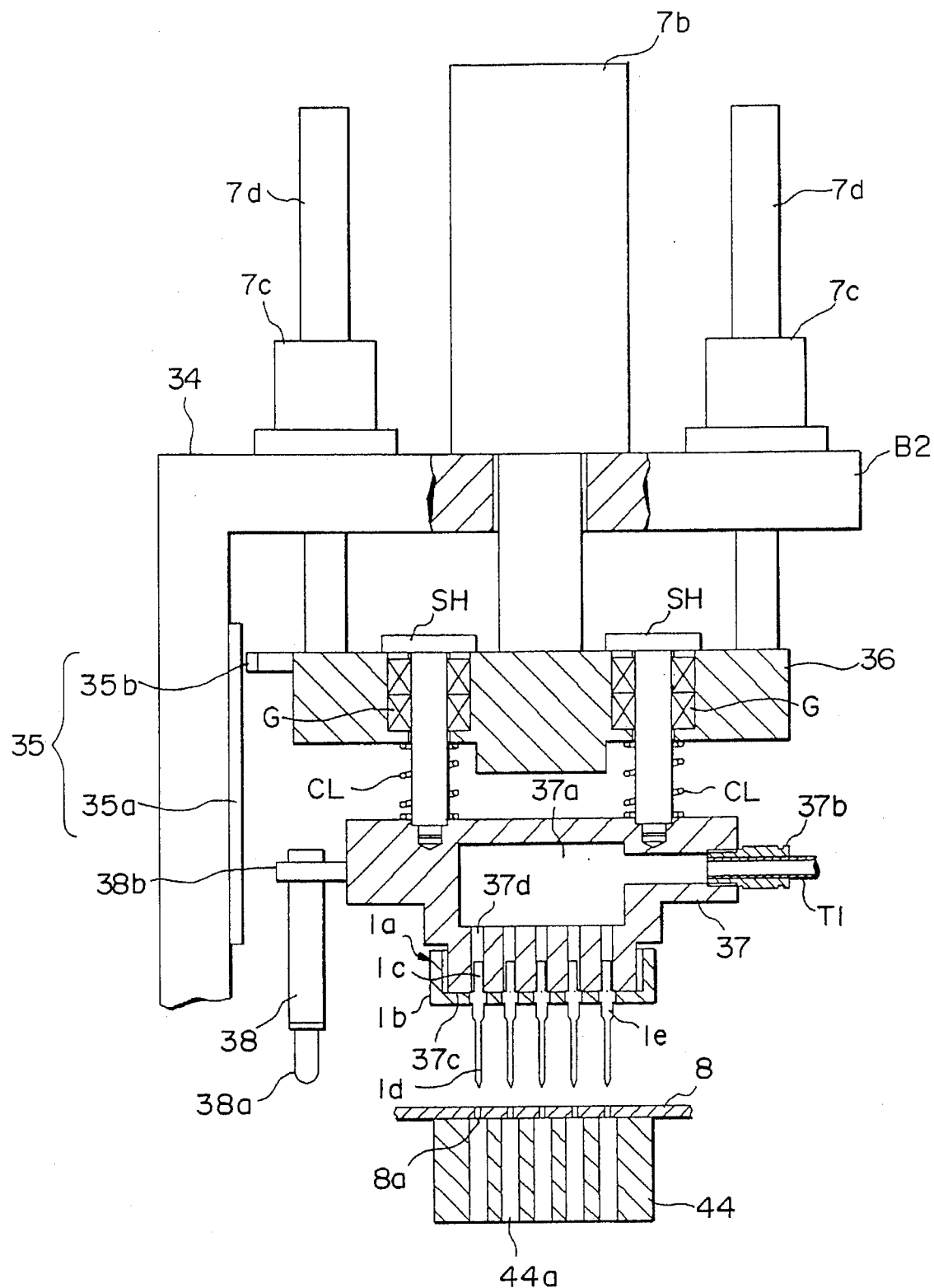
FIG. 13 is a cross sectional view of the essential components in a connector press-fitting state.
Figure 14:
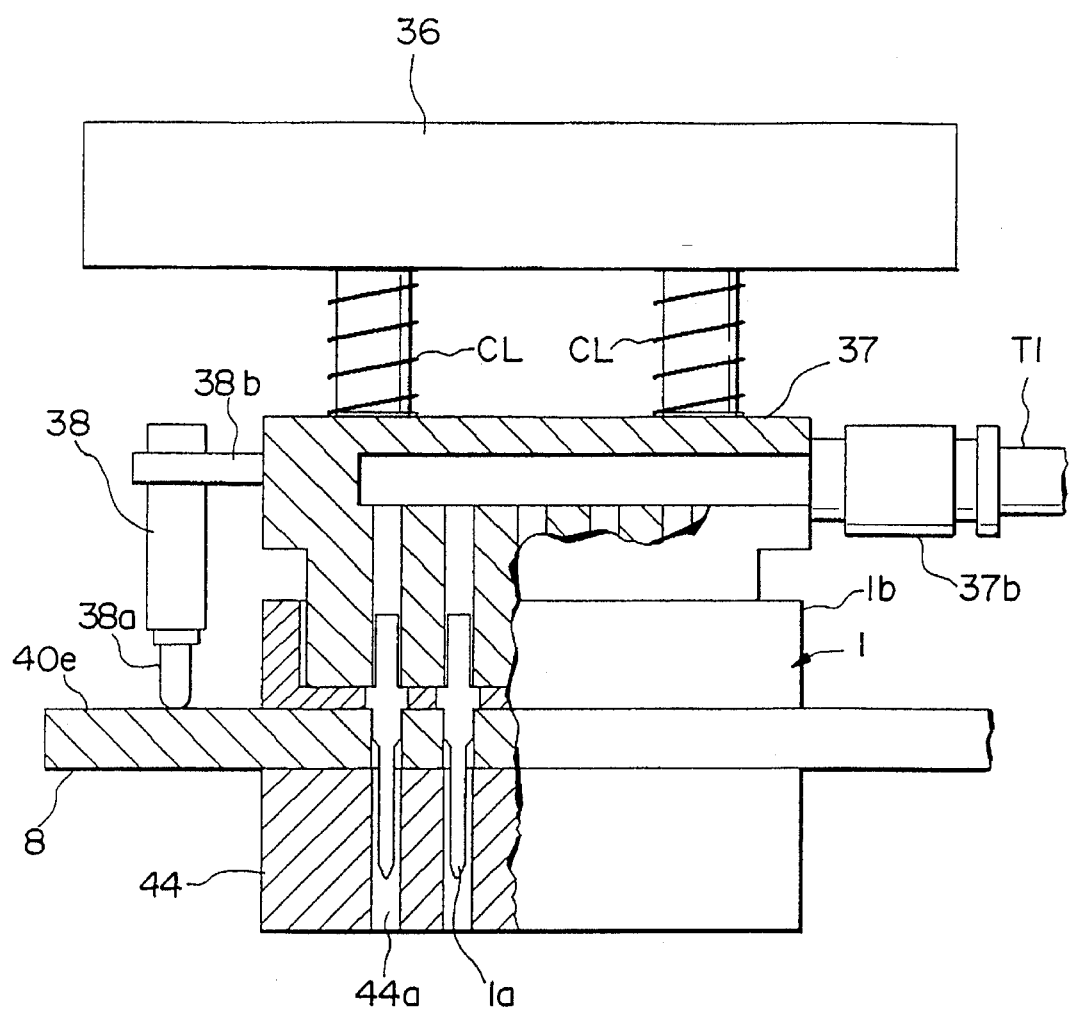
FIG. 14 is a cross sectional view of the essential components in a state of measuring the connector press-fitting amount.

As shown in FIG. 13, a shaft SH is slidably installed in press-fitting block 36 via guide G. In the upper end of this shaft SH, a stopper for stopping the withdrawal of shaft SH is formed, while the lower end of shaft SH is fixed to the aforementioned press-fitting head 37. A compression coil spring CL is connected to shaft SH; this compression coil spring CL biases shaft SH in the downward direction.

A hollow section 37a is formed in the interior portion of press-fitting head 37. A tube T1 which communicates to a vacuum pump and compression pump (not shown in the figures) is connected to this hollow section 37a via joint 37b. In the press-fitting face 37c of press-fitting head 37, through apertures 37d corresponding to the pin arrangement of connector 1 are formed in a manner such that the upper end portions 1c of pins 1a can be inserted therein. These through apertures 37d communicate with hollow section 37a; thus, connector 1 is affixed to press-fitting face 37c by means of conducting pressure reduction of hollow section 37a, while connector 1 is separated from press-fitting head 37 by means of pressurizing this hollow section 37a.

FIG. 12 shows a situation in which press-fitting head 37 is lowered and placed in contact with connector 1 mounted on insertion block 40. Concave portion 40f is formed in standard upper face 40e of the insertion block in the center portion of the contact face with bottom face 1f of connector 1 in a manner corresponding to pins 1a of connector 1. Within this concave portion 40f, a plurality of insertion apertures 40a are formed corresponding to the pin arrangement of connector 1. Connector 1 is thus positioned by means of inserting pins 1a into these insertion apertures 40a. Insertion block 40 is fixed to bottom plate 39a via shaft 40c.

In addition, a measuring head 38 is installed in a side wall of press-fitting head 37 via fixture 38b. As this measuring head 38, it is possible to employ, for example, a differential transforming-type measuring head or the like. Measuring head 38 possesses a movable contact 38a formed on the front tip therein which is fixed facing downward. In this manner, when lowering press-fitting head 37 and affixing connector 1 on insertion block 40, contact 38a comes in contact with and is pushed against standard upper face 40e of insertion block 40. In this manner, the bottom wall thickness T of connector housing 1b can be measured. In addition, the output of measuring head 38 is designed to be transmitted to a control portion, not shown in the figures.

As shown in FIG. 11, a die 44 for supporting printed board 8 is arranged below press-fitting head 37. A plurality of recess apertures 44a are formed in die 44 corresponding to through holes 8a formed in printed board 8 for receiving the pin front tip portions 1d penetrating through printed board 8. Die 44 is installed on NC moving table 43 which is fixed on bed 42. NC moving table 43 possesses X-stage 43a and Y-stage 43b, and moves printed board 8 in the X-Y directions.

In the connector press-fitting apparatus of the aforementioned structure, a connector 1 is initially withdrawn from stocker 2 and inserted into insertion block 40 by means of transporting portion 3. Subsequently, this insertion block 40 into which the aforementioned connector 1 is inserted, is moved to a position facing press-fitting head 37 by means of transferring mechanism 39. Once insertion block 40 is arranged in a specific position, press-fitting head 37 is lowered by means of cylinder 7b, and connector 1 is affixed by means of pushing press-fitting face 37c into contact with connector 1 on insertion block 40.

At this time, contact 38a of measuring head 38 contacts and is pressed against standard upper face 40e of insertion block 40, following which an output signal from measuring head 38 is transmitted to the control portion. From this signal, the bottom wall thickness T of housing 1b is calculated in the control portion, compared with a standard value, and a correctional amount (divergence from the standard value) for the bottom wall thickness T is then computed. Furthermore, the optimal lowering amount corresponding to this bottom wall thickness T is then computed from the standard lowering amount (optimal lowering amount in the case when the bottom wall thickness T equals the standard value) of press-fitting head 37 and the aforementioned correctional amount, and this value is then recorded.

When press-fitting head 37 affixes connector 1, press-fitting head 37 is temporarily raised, and insertion block 40 is returned to its original position by means of transferring mechanism 39. At the same time, moving table 43 is operated, and printed board 8 is arranged below press-fitting head 37 as shown in FIG. 13. Press-fitting head 37 is the once again lowered, and pins 1a of connector 1 in an affixed state are press-fitted into the through holes of printed board 8.

At this time, the lowering amount of press-fitting head 37 is directly measured by means of linear scale 35. When this lowering amount reaches the aforementioned optimal lowering amount, the lowering of press-fitting head 37 is ceased. In this manner, the bottom wall thickness T of housing 1b is initially measured on insertion block 40, and based on this value, the control portion exerts feedback control on the lowering amount of press-fitting head 37. Thus, even when a dispersion exists in the bottom wall thickness T of connector 1, it is possible to press-fit connector 1 and printed board 8 at an appropriate interval. As a result, contact defects of connector 1 resulting from insufficient lowering of press-fitting head 37, as well as damage to printed board 8 from excessive lowering of the aforementioned can be prevented.

When press-fitting of connector 1 to printed board 8 is completed, compressed air is introduced to the interior portion of press-fitting head 37, connector 1 is separated, press-fitting head 37 is raised, and the aforementioned operations are then repeated. In this manner, all of the connectors 1 can be mounted at an optimal press-fitting amount.

Furthermore, it is also possible to combine the above-described control mechanism for regulating the press-fitting amount with the disclosures of the first embodiment, second embodiment, or fourth embodiment (to be described hereinafter). In addition, it is al. so possible to employ, for example, another model such as an optical position measuring sensor in place of the aforementioned measuring head 38 or linear scale 35.

Fourth Embodiment

In the following, the fourth embodiment of the present invention will be explained using FIGS. 15–20. Furthermore, components described in the aforementioned first and second embodiments will be denoted using the same numerals and their explanations will be omitted.

This fourth embodiment differs from the aforementioned first through third embodiments in that a connector can be mounted not only on the front face of the printed board, but also on the reverse face therein. According to the printed board, there are cases in which connectors are mounted on both faces of the printed board, or after the connector is mounted on the front face of the printed board, there are cases in which a separate connector housing is press-fitted to the pin tips of the connector protruding out through the reverse face of the printed board. In the above case, after a connector is mounted on one face of the printed board according to the aforementioned first through third embodiments, it is necessary to reverse the printed board and carry out mounting once again, which takes time and labor. In contrast, it is a new objective of the fourth embodiment to provide a structure in which connectors can be automatically mounted to both faces of the printed board without having to reverse the printed board.

Figure 16:
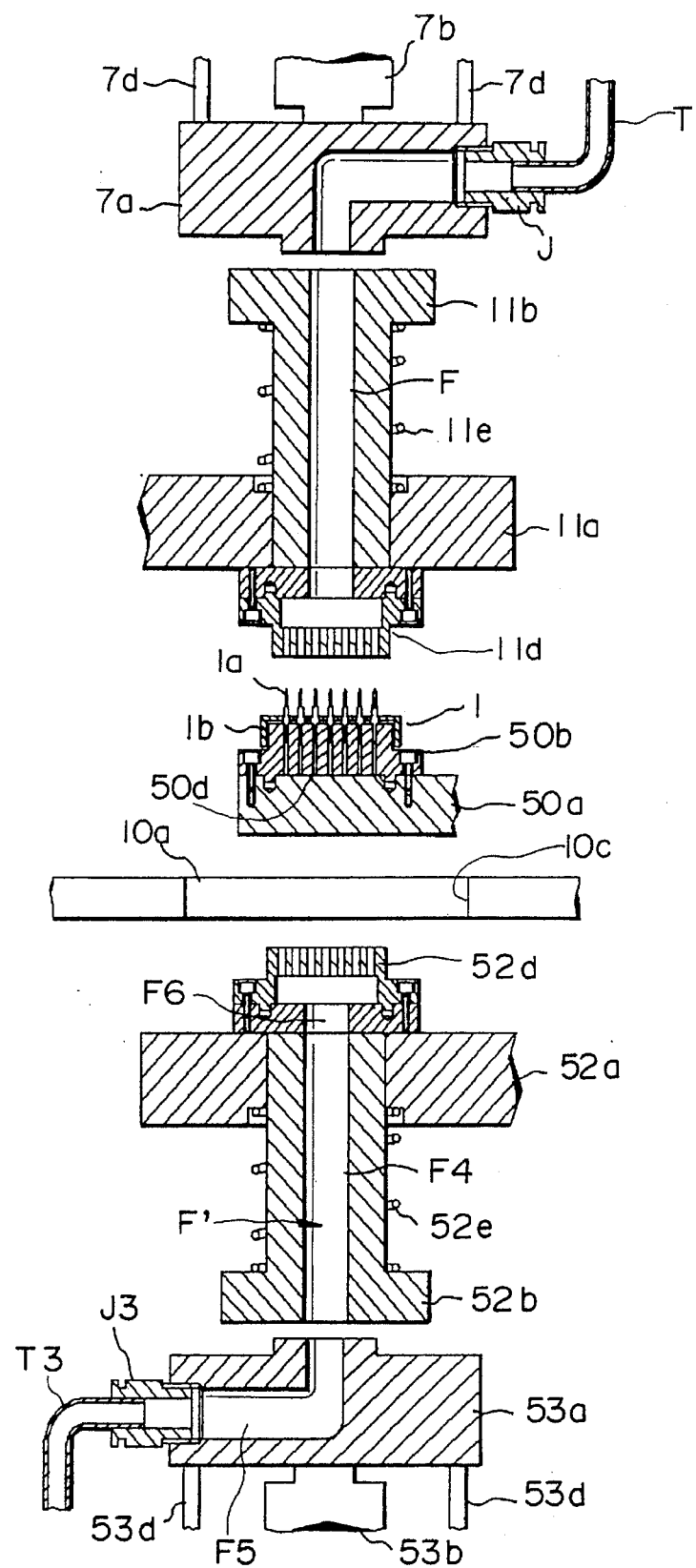
FIG. 16 is a cross sectional view showing the essential component of the fourth embodiment.
Figure 17:
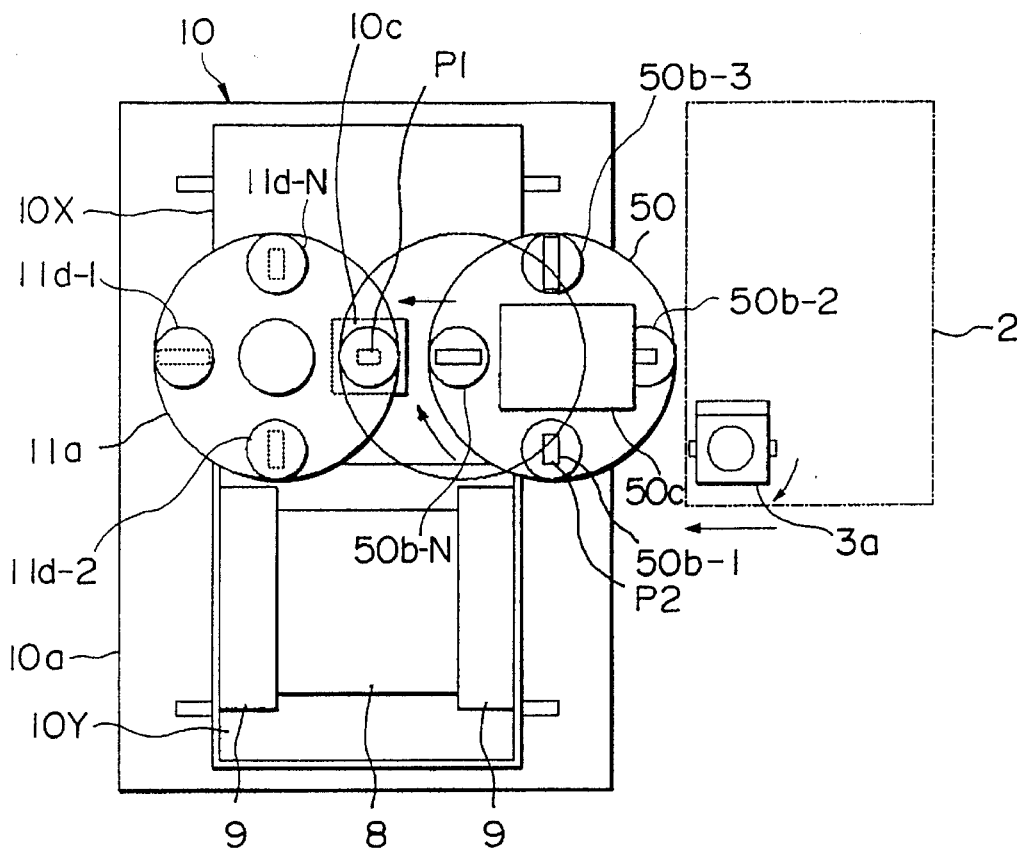
FIG. 17 is a plane view showing the essential component according to the third embodiment.
Figure 18:
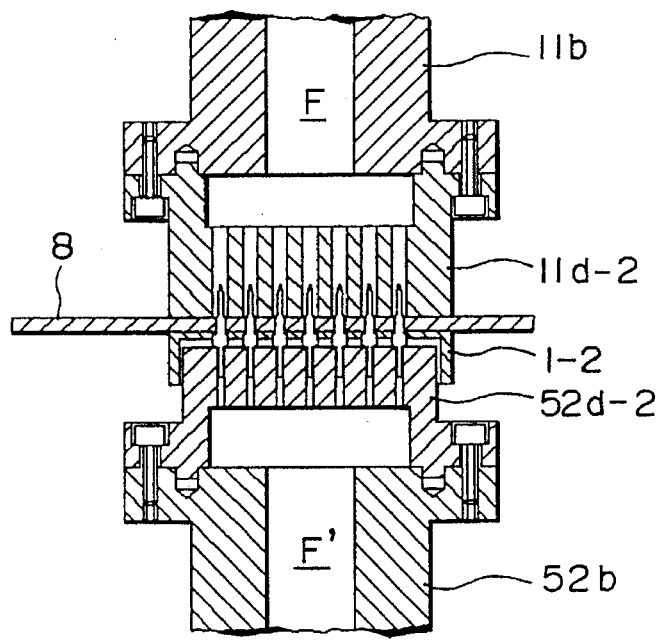

In order to achieve the aforementioned object, according to the fourth embodiment, using as a foundation the structure described in the second embodiment shown in FIG. 6, an insertion turret 50 is provided between press-fitting turret 11 and stopper 2, and pressure-receiving turret 12 and pressure-receiving portion 13 are replaced by pressure-receiving turret 52 and pressure-receiving portion 53. Insertion turret 50 comprises a disk-shaped rotating table 50a which is arranged horizontally, a plurality of various types of insertion blocks 50b-1~50b-N which are fixed to the upper face of the periphery of the aforementioned rotating table 50a, and a driving motor 50c for rotating rotating table 50a. Driving motor 50c is connected to a control portion, not shown in the figures. This control portion controls the portions of the apparatus as information regarding the types of connectors 1 and orientation of pins 1a of connector 1 are previously inputted therein. In the present embodiment, four types of connectors are mounted: as shown in FIG. 17, a total of four insertion blocks 50b are fixed onto rotating table 50a at 90° intervals with respect to each other. As shown in FIG. 16, pin insertion apertures 50d are respectively formed in insertion blocks 50b-1~50b-N in accordance with the shape and pin 1a arrangement of the corresponding connectors 1-1~1-N (N=4).

Figure 15:
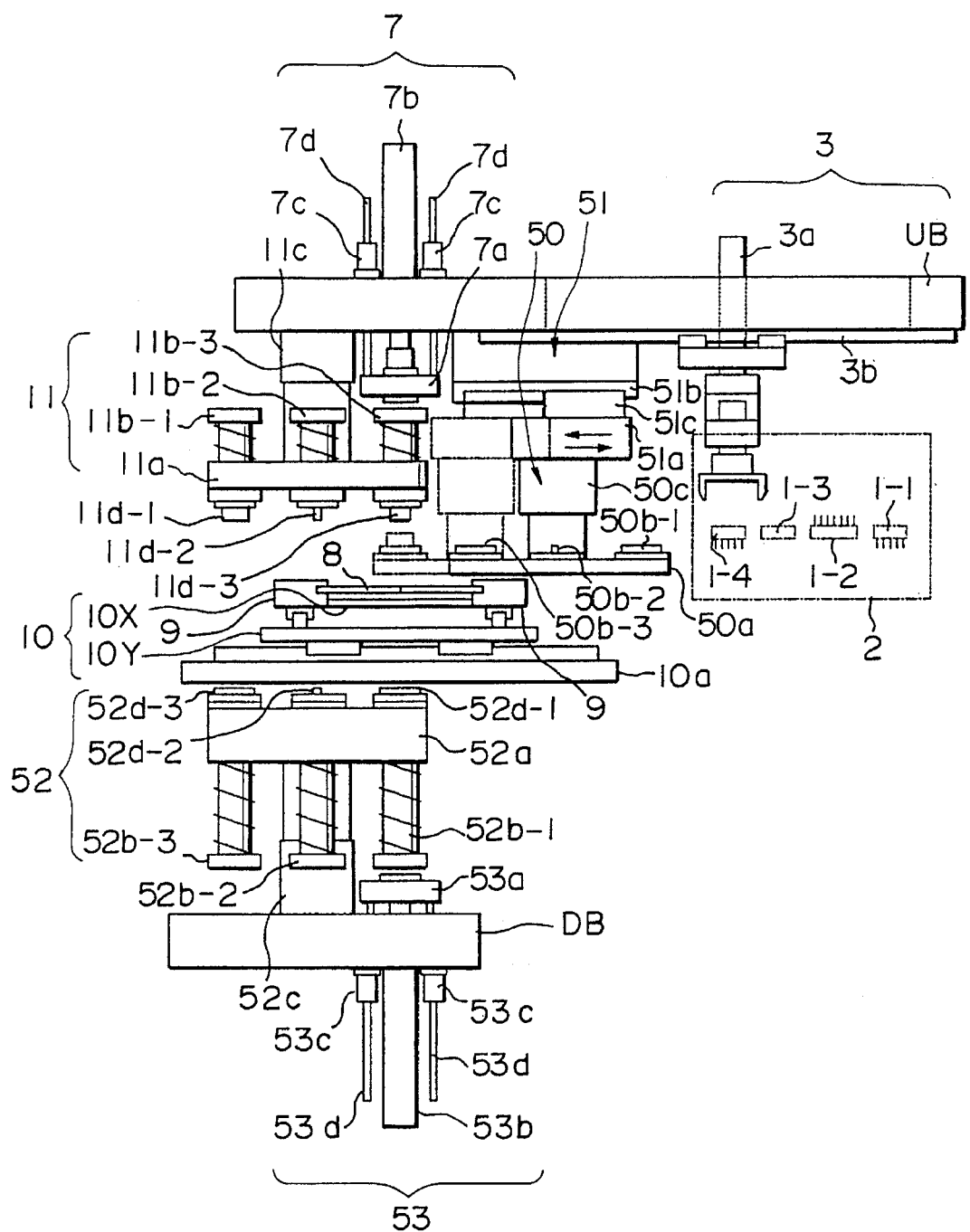
FIG. 15 is a front view showing a connector press-fitting apparatus according to a fourth embodiment of the present invention.

Insertion turret 50 is installed as shown in FIG. 15 such that upward/downward movement is elastically possible with respect to bottom plate 51a of transferring mechanism 51. Transferring mechanism 51 is formed from slide rail 51b which is fixed horizontally to upper base member UB, base plate 51c which is moved by means of this slide rail 51b, and bottom plate 51a which is fixed to this base plate 51c. By operating slide rail 51b, insertion turret 50 can be moved from the press-fitting turret 11 side to the transporting portion 3 side.

As shown in FIG. 15, press-fitting turret 52 is arranged below NC moving table 10, and is installed in lower base member DB. This press-fitting turret 52 is formed from approximately the same structure as press-fitting turret 11, and thus possesses a disk-shaped rotating table 52a and driving motor 52c for rotating the aforementioned. Driving motor 52c is connected to the aforementioned control portion, and rotates rotating table 52a based on directives from this aforementioned control portion. Push rods 52b-1~52b-N are installed penetrating through the through holes formed on the periphery of rotating table 52a with intervals spaced circumferentially thereinbetween. Coil springs 52e, shown in FIG. 16, are installed in each push rod 52b. These push rods 52b are biased in the downward direction with respect to rotating table 52a. In addition, a hollow channel F4 is formed in the interior portion of each push rod 52b.

Press-fitting heads 52d-1~52d-N corresponding to the shape and pin arrangement of each connector 1-1~1-N are respectively fixed to the upper ends of push rods 52b. When push rod 52b positioned at press-fitting position P shown in FIG. 17 is pushed upwards, the upper end of press-fitting head 52d is designed to reach the lower face of printed board 8. In the example shown in the FIGURE, the orientation of each press-fitting head 52d is determined in a manner such that the longitudinal direction of connector 1 mounted on each press-fitting head 52d faces in the radial direction of rotating table 52a. In addition, as shown in FIG. 17, press-fitting head 11d of press-fitting turret 11 and insertion block 50b of insertion turret 50 are arranged with the same orientation. This conformity of orientations is realized in order to achieve reciprocal delivery of connectors. It is possible, however, to modify these orientations when necessary.

Press-fitting portion 53 possessing press-fitting block 53a in which hollow channel F5 is formed, and cylinder 53b for raising/lowering press-fitting block 53a, is installed in lower base member DB as shown in FIG. 15. Insertion block 53a is supported by lower base member DB via guide 53c and guide shaft 53d in a manner such that upward/downward movement is possible. This press-fitting block 53a is positioned below the press-fitting position P shown in FIG. 17. The lower end face of the push rod 52b at press-fitting position P faces the upper face of press-fitting block 53a, and when press-fitting block 53a is pushed upwards by means of cylinder 53b, hollow channel F5 in press-fitting block 53a, hollow channel F4 in push rod 52b, and hollow channel F6 in press-fitting head 52d are connected to form channel F'. Channel F' is connected to tube T3 via joint J3 installed into a side face of press-fitting block 53a. This tube T3 is connected to a vacuum pump and a pressure pump. Connector 1 is fixed to press-fitting head 52d by means of reducing pressure within channel F', while connector 1 is separated from press-fitting head 52d by means of pressurizing the same.

Stocker 2 shown in FIG. 15 is capable of storing a plurality of various types of connectors 1: this stocker 2 is capable of storing the same type of connector 1 facing upward or downward. For example, in FIG. 15, four types of connectors 1-1~1-4 are stored within stocker 2. Connector 1-1 is to be press-fitted to the upper face of printed board 8; connector 1-2 is to be press-fitted to the lower face of printed board 8; connector 1-3 serves simply as a housing 1b to be press-fitted to connector pins 1a protruding out from the lower face of printed board 8; and connector 1-4 is to be press-fitted to the upper face of printed board 8 wherein housing 1b of connector 1-3 is to be fixed to the pins therein. Furthermore, in the case when the sides and/or orientation of pins 1a of the same type of connectors 1 are different, or in the case when only housing 1b is employed, it is necessary to handle these components as different types of connectors 1.

When printed board 8 is arranged at press-fitting position P1 shown in FIG. 17, an opening, not shown in the figures, positioned at a location below printed board 8 is formed respectively in base 10a, table 10X, and table 10Y of NC moving table 10. Furthermore, an opening 10c is formed in base 10a at a position corresponding to insertion position P2. In this manner, press-fitting head 52d at a press-fitting position P can be raised to a position extending to approximately the reverse face of printed board 8 by passing through opening 10c.

In the apparatus formed from the aforementioned structure according to the fourth embodiment, the control portion initially generates a first directive for specifying the type of connector 1 to be press-fitted to printed board 8, second directive for specifying the press-fitting face of printed board 8 to which connector 1 will be press-fitted, and a third directive for specifying the mounting position of connector 1. The actions hereafter differ according to the following cases (1)~(3).

(1) The following relates to the case where connector 1-1 is specified by means of the first directive for mounting on the front face, and the front face of the printed board is specified as the connector mounting position by means of the second directive:

Initially, connector 1-1 is withdrawn from stocker 2 by means of grasping mechanism 3a of transporting portion 3 and transported to insertion position P2. After receiving the first directive, insertion turret 50 and transferring mechanism 51 select insertion block 50b-1 corresponding to connector 1-1 and move it to insertion position P2. In addition, grasping mechanism 3a is lowered, and connector 1-1 is engaged with insertion block 50b-1.

Subsequently, insertion block 50b-1 into which connector 1-1 is inserted is moved to press-fitting position P1 by means of insertion turret 50 and transferring mechanism 51. In the meantime, press-fitting turret 11 similarly selects press-fitting head 11d-1 corresponding to connector 1-1 and moves it to press-fitting position P1. Press-fitting portion 7 then pushes press-fitting head 11d-1 downward in contact with connector 1-1 inserted into insertion block 50b by means of cylinder 7b. Connector 1-1 is then affixed to press-fitting head 11d-1 by means of reducing the pressure in channel F. Following this, press-fitting head 11d-1 is raised, and insertion turret 50 is returned to its original position by means of transferring mechanism 51.

Figure 20:
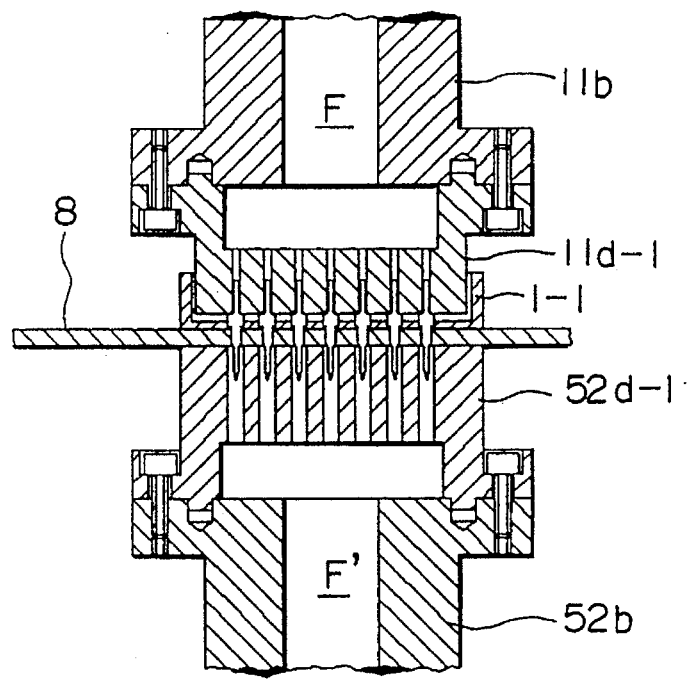
FIG. 20 is a cross sectional view of the essential components showing a state in which a connector is press-fitted to the front face of a printed board.

Upon receiving the third directive, NC moving table 10 moves printed plate 8, and positions the connector mounting position of this printed plate 8 at press-fitting position P1. Upon receiving the first directive, press-fitting turret 52 selects press-fitting head 52d-1 corresponding to connector 1-1 and moves this to press-fitting position P. Press-fitting head 11d-1 is then pushed downward by means of cylinder 7b, while press-fitting head 52d-1 is pushed upwards by means of cylinder 53b. In this manner, the connector mounting position of printed plate 8 and connector 1-1 are sandwiched between of the aforementioned press-fitting head 11d-1 and press-fitting head 52d-1. As shown in FIG. 20, pins 1a of connector 1-1 are then respectively press-fitted into the pin insertion apertures of printed board 8. When this has been completed, pressure reduction of channel F is ceased, press-fitting heads 11d-1 and 52d-1 are separated from printed board 8 and moved back to their original positions, thereby completing the mounting operation.

(2) In the following connector 1-2 is specified by means of the first directive for mounting on the reverse face, and the reverse face of the printed board is specified as the connector mounting position by means of the second directive:

Initially, connector 1-2 is withdrawn from stocker 2 by means of transporting portion 3 and delivered to press-fitting head 11d-2 at press-fitting position P1 via insertion turret 50. Press-fitting head 11d-2 is the raised in a state in which connector 1-2 is affixed and supported thereon. Subsequently, printed board 8 is removed from press-fitting position P1 by means of NC moving table 10, and through aperture 10c formed in base 10a is then positioned at press-fitting position P1 as shown in FIGS. 16 and 17.

Subsequently, press-fitting head 11d is pushed downward by means of cylinder 7b, and press-fitting head 52d is pushed upwards through aperture 10c by means of cylinder 53b, placing this press-fitting head 52d in contact with the lower base of connector 1 affixed to press-fitting head 11d. Connector 1 is then affixed to press-fitting head 52d by means of pressure-reduction in channel F', while pressure-reduction of channel F is ceased. Furthermore, after press-fitting head 11d is raised and press-fitting head 52d is lowered, the connector mounting position of printed board 8 is then positioned at press-fitting position P1 by means of NC moving table 10.

Subsequently, connector 1-2 affixed to press-fitting head 52d is press-fitted from the reverse face of printed board 8, as shown in FIG. 18, by means of once again lowering press-fitting head 11d and raising press-fitting head 52d. At this time, the force pushing downward on push rod 11d by means of cylinder 7b is designed to be controlled at a level greater than the force pushing upward on push rod 52b by means of cylinder 53b. Pressure-reduction of channel F' is then ceased, press-fitting heads 11d and 52d are separated from printed board 8 and returned to their original positions to complete the mounting process.

Figure 19:
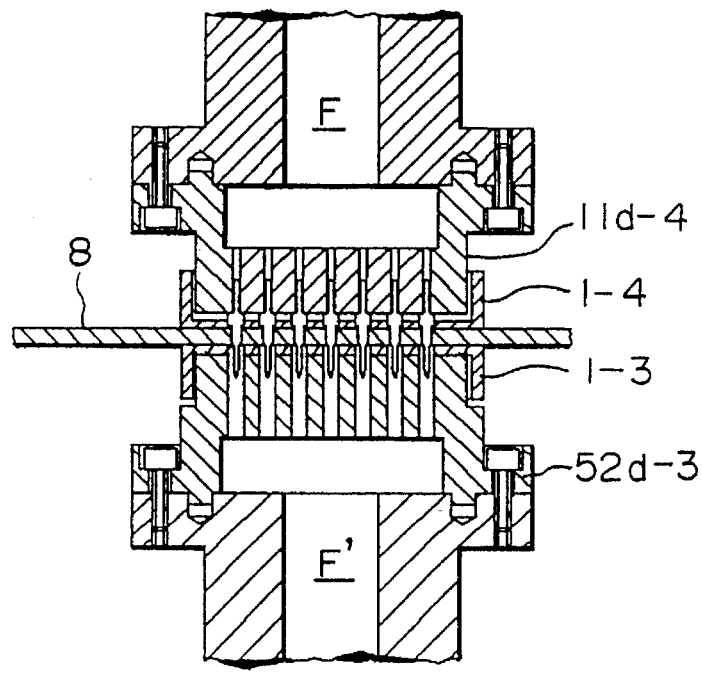
FIG. 19 is a cross sectional view of the essential components showing a state in which a connector is press-fitted to the front face of a printed board, and a housing is press-fitted to the pins protruding from this reverse face.

(3) In the following case, the press-fitting of connector 1-4 is conductive from the upper face of printed board 8, and housing 1-3 for mounting on the reverse side is press-fitted to the connector pins 1a of the aforementioned protruding out of the bottom face:

Initially, based on the first directive, housing 1-3 is withdrawn from stocker 2 by means of transporting portion 3. In a manner similar to (2) above, after housing 1-3 is affixed to press-fitting head 52-3, connector 1-4 is affixed to press-fitting head 11d-4 as in (1) above. Subsequently, after the connector mounting position of printed board 8 is positioned at press-fitting position P1 by means of NC moving table 10, and printed board 8, connector 1-4, and housing 1-3 are sandwiched between press-fitting head 52d-3 and press-fitting head 11d-4, as shown in FIG. 19. In this manner, connector 1-4 is press-fitted from the upper face of printed board 8, and at the same time housing 1-3 for mounting on the reverse face is press-fitted to connector pins 1a of the aforementioned which protrude out from the bottom face therein. Once the press-fitting operations are completed, press-fitting portion 7 and press-fitting portion 53 are returned to their initial states, and the process moves on the next press-fitting operation.

As described above, according to the apparatus of the fourth embodiment, it is possible to mount a plurality of various types of connectors 1 automatically to both faces of printed board 8 without having to reverse the printed board 8. As a result, mounting can be conducted with a high efficiency with regard to a two-face mountable-type printed board. In addition, either of press-fitting turrets 11 and 52 can be used as the turret for press-fitting or pressure-receiving, and delivery of connector 1 is conducted from the upper press-fitting turret 11 to the lower press-fitting turret 52. As a result, there is no need to provide a connector transporting mechanism dedicated to press-fitting turret 52, which results in a higher functionality and a less complex structure when compared with the apparatuses described in the aforementioned first through third embodiments.

What is claimed is:

1. A connector press-fitting apparatus for mounting a connector on a printed board, the apparatus comprising:

(a) control means for generating a first directive to specify a type of connector to be press-fitted, a second directive for specifying a mounting position on said printed board at which said type of connector is to be press-fitted; and a third directive for specifying a storage position of said type of connector;

(b) positioning means for maintaining said printed board, and for moving said printed board in accordance with said second directive and said third directive;

(c) storing means for storing a plurality of connector types for movement by said positioning means along with said printed board;

(d) a plurality of types of press-fitting heads, each having a surface with a channel opening opposing one face of a printed board maintained by the positioning means, each said press-fitting head being mounted to be accessible to and separable from said one face of the maintained printed board in opposite directions relative to said one face of said printed board;

(e) press-fitting head switching means for selecting and positioning one of said plurality of types of press fitting heads corresponding to said type of connector selected by said first directive at a predetermined press-fitting position;

(f) head moving means for moving said selected and positioned press-fitting head in said opposite directions with respect to said one face of said printed board;

(g) first pressure-reducing means for reducing the pressure of said channel to affix a connector type to said press-fitting head at said press-fitting position;

(h) transporting means for transporting said connector type specified by said first directive from said storing means to said selected press-fitting head;

(i) a plurality of pressure receiving heads, each having a surface with pin insertion apertures corresponding to each type of connector and with a channel opening opposing a face of the printed board opposite said one face of the maintained printed board, each said pressure-receiving head being mounted to be accessible to and separable from said opposite face of the maintained printed board in opposite directions toward and away from said one face of said maintained printed board;

(j) pressure-receiving head switching means for selecting and positioning one of said plurality of types of press fitting heads corresponding to said type of connector selected by said first directive at a predetermined press-fitting position; and (k) pressure-receiving head moving means for moving said pressure-receiving head in opposite directions toward and away from said opposite face of the printed board at said press-fitting position.

2. A connector press-fitting apparatus according to claim 1, wherein the storing means includes a plurality of trays for storing respective types of connectors, said positioning means supporting said trays to move along with said printed board and said insertion block.

3. A connector press-fitting apparatus for mounting a connector on a printed board, the apparatus comprising:

(a) control means for generating a first directive to specify the type of connector to be fitted, and a second directive to specify a mounting position on a printed plate at which said connector is to be fitted;

(b) positioning means for maintaining said printed board, and for moving said printed board based on said second directive;

(c) a plurality of insertion blocks for movement by said positioning means along with said printed board, and having pin insertion apertures for receiving pins of each type of connector;

(d) storing means for storing a plurality of types of connectors;

(e) transporting means for withdrawing from said storing means a type of connector corresponding to said first directive, for transporting said connector to a corresponding insertion block, and for inserting said connector into said insertion block;

(f) a plurality of types of press-fitting heads, each having a surface with a channel opening opposing one face of a printed board maintained by the positioning means, each said press-fitting head being mounted to be accessible to and separable from said one face of the maintained printed board in opposite directions toward and away from said one face of said printed board;

(g) press-fitting head switching means for selecting and positioning one of said plurality of types of press fitting heads corresponding to said type of connector selected by said first directive at a predetermined press-fitting position;

(h) head moving means for moving said selected and positioned press-fitting head in said opposite directions with respect to said one face of said printed board;

(i) first pressure-reducing means for reducing the pressure of said channel to affix a connector type to said press-fitting head at said press-fitting position;

(j) a plurality of pressure receiving heads, each having a surface with pin insertion apertures corresponding to each type of connector and with a channel opening opposing a face of the printed board opposite said one face of the maintained printed board, each said pressure-receiving head being mounted to be accessible to and separable from said opposite face of the maintained printed board in opposite directions toward and away from said one face of said maintained printed board;

(k) pressure-receiving head switching means for selecting and positioning one of said plurality of types of press fitting heads corresponding to said type of connector selected by said first directive at a predetermined press-fitting position; and (l) pressure-receiving head moving means for moving said pressure-receiving head in opposite directions toward and away from said opposite face of the printed board at said press-fitting position.

4. A connector press-fitting apparatus for mounting a connector on a printed board, the apparatus comprising:

(a) positioning means for supporting and moving a printed board;

(b) storing means for storing a connector;

(c) an insertion block having pin insertion apertures for receiving pins of said connector;

(d) transporting means for withdrawing said connector from said storing means, transporting said connector to said insertion block, and inserting said pins of the connector in the insertion apertures;

(e) a press-fitting head having a channel opening facing a printed board maintained by the positioning means, said press-fitting head being mounted to be accessible to and separable from said one face of the maintained printed board in a direction substantially perpendicular to the plane of said one face of said printed board;

(f) block moving means for moving said insertion block between a position facing toward said press-fitting head and a position facing away from said press-fitting head;

(g) head moving means for moving said press-fitting head in said opposite directions with respect to said printed board;

(h) pressure-reducing means for reducing pressure of said channel at said press-fitting position to affix said connector to said press-fitting head;

(i) thickness measuring means provided in said press-fitting head for measuring a bottom wall thickness of said connector at the time when said press-fitting head is placed in contact with said connector maintained by said insertion block;

(j) lowering distance measuring means for measuring the lowering distance of said press-fitting head at the time of press-fitting said connector to said printed board by said press-fitting head;

(k) control means for computing an optimal lowering distance of said press-fitting head from said bottom wall thickness measured by said thickness measuring means, and for controlling said head moving means in a manner such that said measured lowering distance conforms to said optimal lowering distance.

5. A connector press-fitting apparatus according to claim 4, comprising a second pressure reducing means, connected to a channel communicating with said pin insertion apertures and formed in an interior position of said insertion block; for reducing pressure of the channel to affix said connector to said insertion block.

6. A connector press-fitting apparatus according to claim 4, wherein said thickness measuring means includes a contact distance sensor having an extendible contact, said contact distance sensor being affixed to said press-fitting head with said contact being placed in contact with said insertion block at the time when said press-fitting head contacts said connector inserted into said insertion block.

7. A connector press-fitting apparatus according to claim 4, wherein said lowering distance measuring means comprises a magnet scale having a magnetic graduation, and a magnetic head facing said magnet scale; one of said magnet scale and said magnetic head being connected to said press-fitting head, while the other of said magnet scale and said magnetic head is immovable.

8. A connector press-fitting apparatus for mounting connectors on both faces of a printed board, the apparatus comprising:

(a) control means for generating, a first directive to specify a type of connector to be press-fitted, a second directive to specify a press-fitting face of said printed board to which said connector is to be press-fitted, and a third directive to specify a mounting position on said printed board of said connector;

(b) positioning means for supporting a printed board, and for moving said printed board in accordance with said third directive;

(c) storing means for storing a plurality of types of connectors in a state identical to that state existing at the time of mounting on said printed board;

(d) a plurality of types of front face press-fitting heads having a channel opening facing a printed board maintained by the positioning means, said press-fitting head being mounted to be accessible to and separable from said front face of the maintained printed board in opposite directions toward and away from said front face of said printed board maintained by said positioning means;

(e) front surface press-fitting head switching means for selecting a front face press-fitting head corresponding to said connector to be press-fitted from among said front face press-fitting heads based on said first directive, and arranging said selected front face press-fitting head at a predetermined press-fitting position;

(f) front face press-fitting head moving means for moving said front face press-fitting head at said press-fitting position in said opposite directions with respect to said front face of said printed board;

(g) pressure-reducing means for affixing said connector to said front face press-fitting head by pressure reduction of said channel of said front face press-fitting head at said press-fitting position;

(h) transporting means for transporting said connector specified by said first directive from said storing means, and delivering said connector to said selected front face press-fitting head;

(i) a plurality of reverse-face press-fitting heads mounted to be accessible to and separable from said reverse face of the printed board maintained by the positioning means in opposite directions toward and away from said reverse face of said printed board, and in which engaging means are respectively formed in a surface facing said printed board which are respectively engageable with one type of said connector;

(j) reverse-face press-fitting head switching means for selecting a reverse face press-fitting head corresponding to said connector to be press-fitted from among said reverse face press-fitting heads based on said first directive, and for arranging said selected reverse-face press-fitting head at a predetermined press-fitting position;

(k) reverse-face press-fitting head moving means for moving said reverse-face press-fitting head at said press-fitting position in the opposite directions toward and away from the printed board; and (l) passage means for delivering said connector from said front face press-fitting head to said reverse-face press-fitting head at said press-fitting position.

9. A connector press-fitting apparatus according to claim 8, wherein connectors and connector housings are stored in said storing means; and control means for controlling each portion of said apparatus in order to sequentially conduct the steps of:

(i) transporting said connector housing from said storing means by said transporting means, and delivering said connector housing to a corresponding front face press-fitting head;

(ii) moving said front face press-fitting head maintaining said connector housing and said reverse-face press-fitting head corresponding to said connector housing to said press-fitting position by said front-face press-fitting head switching means and said reverse-face press-fitting head switching means, respectively;

(iii) bringing said front-face press-fitting head and said reverse-face press-fitting head into close proximity via said passage means by said front-face press-fitting head switching means and said reverse-face press-fitting head moving means, respectively, and delivering said connector housing to said reverse-face press-fitting head;

(iv) transporting a connector corresponding to said connector housing from said storing means by said transporting means, and delivering said connector to said front-face press-fitting head; and (v) bringing said front-face press-fitting head and said reverse-face press-fitting head into close proximity by said front-face press-fitting head switching means and reverse-face press-fitting head moving means, respectively, and press-fitting said connector from said front face of said printed board while press-fitting said connector housing to pins of said connector protruding from said reverse face of said printed board.

10. A connector press-fitting apparatus for press-fitting a connector to a printed board, the apparatus comprising:

(a) storing means for storing a plurality of types of connectors;

(b) positioning means for maintaining, moving, and positioning a printed board;

(c) a plurality of press-fitting heads, each being of a different type to correspond to a respective one of said plurality of types of connectors, each said press-fitting head having a surface with a channel opening opposing a printed board maintained by the positioning means, each said press-fitting head being mounted to be accessible to and separable from the maintained printed board in opposite directions toward and away from the printed board;

(d) head moving means for moving each said press-fitting head in the opposite directions;

(e) pressure reducing means for affixing a connector to each said press-fitting head by pressure reduction of said channel;

(f) transporting means for transporting connectors from said storing means and delivering said connectors to a respective one of said plurality of press-fitting heads; and (g) a plurality of types of said pressure-receiving means each corresponding to one of said types of connectors for supporting said printed board from a reverse face therein at the time of press-fitting one of said types of connectors to said printed board by one of said plurality of press-fitting heads; and switching means on a press-fitting side and switching means on a pressure-receiving side of said printed board for selecting one of said plurality of press-fitting heads and pressure receiving means corresponding to said type of connector to be press-fitted, and for arranging said selected press-fitting head and pressure-receiving means at a predetermined press-fitting position.

11. A connector press-fitting apparatus according to claim 10, further comprising:

control means for generating a first directive to specify a type of connector to be press-fitted, a second directive to specify a mounting position on said printed board at which the type of connector will be press-fitted, and a third directive to specify a storage position of said type of connector;

each of said head switching means selecting one of the plurality of press-fitting head and pressure-receiving means corresponding to a respective type of connector specified by said first directive, said positioning means positioning said printed board according to said second directive; and said transporting means transporting a connector from said storage position specified by said third directive.

12. A connector press-fitting apparatus according to claim 10, wherein said printed board has a plurality of pin insertion apertures, and said connector press-fitting apparatus includes means for press-fitting pins of said connector into said pin insertion apertures.

13. A connector press-fitting apparatus for press-fitting a connector to a printed board, the apparatus comprising:

(a) storing means for storing connectors;

(b) positioning means for maintaining, moving, and positioning a printed board;

(c) a press-fitting head having a surface with a channel opening opposing a printed board maintained by the positioning means, said press-fitting head being mounted to be accessible to and separable from the maintained printed board in in opposite directions toward and away from the board;

(d) head moving means for moving said press-fitting head in the opposite directions with respect to said printed board;

(e) first pressure reducing means for affixing a connector to said press-fitting head by pressure reduction of said channel;

(f) transporting means for transporting connectors from said storing means and delivering said connectors to a press-fitting head; and (g) pressure-receiving means accessible to and separable from said printed board for supporting said printed board from a reverse face thereof at the time of press-fitting a connector to said printed board by said press-fitting head, said pressure receiving means including a pressure receiving head having a surface facing said printed board with pin insertion apertures corresponding to connector pins, and a channel communicating with said pin insertion apertures, said pressure receiving head being mounted to be accessible to and separable from the printed board in the opposite directions;

means for moving said pressure-receiving head in said opposite directions; and second pressure-reducing means for affixing a connector to said pressure-receiving head by pressure reduction of said channel.

14. A connector press-fitting apparatus according to claim 13, wherein said positioning means has a delivery passage for delivering a connector from said press-fitting head to said pressure-receiving head, said printed board being positioned at said press-fitting position by said positioning means, and said printed board and said connector being sandwiched between said press-fitting head and said pressure-receiving head for enabling mounting said connector to a reverse face of said printed board.

15. A connector press-fitting apparatus for press-fitting a connector to a printed board, the apparatus comprising:

(a) storing means for storing connectors;

(b) positioning means for maintaining, moving, and positioning a printed board;

(c) a press-fitting head having a surface with a channel opening opposing a printed board maintained by the positioning means, said press-fitting head being mounted to be accessible to and separable from the maintained printed board in opposite directions toward and away from the board;

(d) head moving means for moving each said press-fitting head in said opposite directions;

(e) pressure reducing means for affixing a connector to said press-fitting head by pressure reduction of said channel;

(f) transporting means for transporting connectors from said storing means and delivering said connectors to a press-fitting head;

(g) an insertion block into which a connector on the surface of said transporting means is inserted for delivering a connector to said press-fitting head, said press-fitting head including thickness measuring means for measuring a bottom wall thickness of a connector at the time said press-fitting head receives the connector inserted in said insertion block;

(h) measurement means for measuring the press-fitting amount of a connector to said printed board at the time said connector is press-fitted to said printed board by said press-fitting head;

(i) control means for controlling said head moving means in a manner such that said press-fitting amount measured by said press-fitting amount measuring means equals a value corresponding to the bottom wall thickness measured by said thickness measuring means; and (j) pressure-receiving means for supporting said printed board from a reverse face thereof at the time of press-fitting a connector to said printed board by said press-fitting means.

* * * * *